United States Patent
Mattausch et al.

(10) Patent No.: US 7,117,291 B2
(45) Date of Patent: Oct. 3, 2006

(54) MEMORY WITH SYNCHRONOUS BANK ARCHITECTURE

(75) Inventors: Hans Jurgen Mattausch, Higashihiroshima (JP); Tetsushi Koide, Higashihiroshima (JP); Tetsuo Hironaka, Hiroshima (JP); Hiroshi Uchida, Ogori (JP); Koh Johguchi, Hiroshima (JP); Zhaomin Zhu, Higashihiroshima (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 401 days.

(21) Appl. No.: 10/787,240

(22) Filed: Feb. 27, 2004

(65) Prior Publication Data

US 2005/0125594 A1  Jun. 9, 2005

(30) Foreign Application Priority Data

Jun. 12, 2003 (JP) .............................. 2003-167989

(51) Int. Cl.
*G11C 5/00* (2006.01)
*G06F 12/06* (2006.01)

(52) U.S. Cl. .......................................... 711/5; 711/104
(58) Field of Classification Search ...................... None
See application file for complete search history.

(56) References Cited

U.S. PATENT DOCUMENTS 6,609,174 B1 * 8/2003 Naji ........................... 711/104
6,877,071 B1 * 4/2005 Sherman ...................... 711/149
2003/0135699 A1 * 7/2003 Matsuzaki et al. ........... 711/149
2004/0186945 A1 * 9/2004 Jeter et al. ..................... 711/5

OTHER PUBLICATIONS

H.J. Mattausch, "Hierarchical architecture for area-efficient integrated N-port memories with latency-free multi-gigabit per second access bandwidth", Electronics Letters, Aug. 19th, 1999, vol. 35, No. 17, pp. 1-2.
N. Omori et al., "Compact central arbiters for memories with multiple read/write ports", Electronics Letters, Jun. 21st, 2001, vol. 37, No. 13, pp. 811-813 (w/ English Translation).
H.J. Mattausch, "Area-Efficient Multi-Port SRAMs for On-Chip Data-Storage with High Random-Access Bandwidth and Large Storage Capacity", IEICE Trans. Electron., vol. E84-C, No. 3, Mar. 2001, pp. 410-418.

* cited by examiner

*Primary Examiner*—Kevin Verbrugge
(74) *Attorney, Agent, or Firm*—McDermott Will & Emery LLP

(57) ABSTRACT

In a synchronous multi-port bank memory, registers/buffers receive a read/write signal and an address signal from each of external ports, receive and send a data signal to and from each of the external ports, and receive and send a port block signal. An access conflict management circuit receives the address signals from the registers and buffers and generates the port block signal when an access conflict to the bank occurs. A switching network receives the read/write signal and the address signal from the registers/buffers and generates a bank selection signal when no port block signal is received, so as to activate the selected bank. Thus, memory access cycle time is shortened. A synchronous 1-port bank memory is also constructed similarly.

15 Claims, 26 Drawing Sheets

Fig. 11 ADDRESS DECODER AND PRECHARGING IN 1-PORT MEMORY $A_i$ : BLOCK ADDRESS
m : BLOCK ADDRESS BIT NUMBER
SH : EXTERNAL CONTROL SIGNAL $C_{n,n'}$ : CONFLICT DETECTION SIGNAL
$PB_n$ : PORT BLOCK SIGNAL

ADDRESS INPUT FROM
ACTIVE-ADDRESS CONNECT CIRCUIT

MEMORY WITH SYNCHRONOUS BANK ARCHITECTURE

BACKGROUND OF THE INVENTION

1. Field of the Invention

The present invention relates to a memory having a synchronous bank memory architecture.

2. Description of Prior Art

Synchronous multi-port memories can process read/write instructions in parallel. A multi-port memory has problems on area efficiency and arbitration for access conflicts. A multi-port bank memory has many 1-port memories with 1-port memory cells, referred to as banks, connected to the ports. Because 1-port cells are used, an area occupied by the memory can be decreased if compared with a conventional memory with N-port cells. Two architectures, that is, crossbar memory architecture and hierarchical memory architecture (HMA), are developed for a multi-port bank memory. In the crossbar multi-port memory, crossbar switches are provided between banks and ports. An HMA multi-port memory has a transition circuit between a port and N ports provided in each bank, row and column selectors for accessing one of the banks arranged in a matrix, and a central conflict management circuit is operated in parallel to the row and column selectors (for example, refer to H. J. Mattausch, Koji Kishi and Takayuki Gyohten, "Area-efficient multi-port SRAMs for on-chip data-storage with high random-access bandwidth and large storage capacity," IEICE Transactions on Electronics, Vol. E84-C, No. 3, p. 410, 2001, and H. J. Mattausch, "Hierarchical architecture for area-efficient integrated N-port memories with latency-free multi-gigabit per second access bandwidth," IEE Electronics Letters, Vol. 35, No. 17, pp. 1441–1443, 1999).

In a synchronous multi-port bank memory, in order to minimize access time, bit lines are precharged to a suitable voltage, and a sense amplifier is used conventionally. Memory access and the precharging of the bit lines are performed at different clock phases. For example, as shown in FIG. 1(a), the memory access is performed while clock signal ck="1", and the precharging is performed while clock ck="0". Therefore, a clock cycle time for the memory access (or memory access cycle time) consists of a sum of the precharging time and the memory access time, so that the clock cycle time becomes longer than the actual access time. However, in principle, it is desirable that the memory access cycle time is shortened to the memory access time.

SUMMARY OF THE INVENTION

An object of the invention is to shorten memory access cycle time in a synchronous bank memory.

In one aspect of the present invention, a synchronous multi-port bank memory comprises a plurality of first layer modules, each of which including a bank consisting of a plurality of 1-port memory cells and a port transition circuit between 1 port and N ports. A clock generator generates an internal clock signal and sends the internal clock signal to the first layer modules. Registers and buffers receive a read/write signal and an address signal from each of external ports, receive and send a data signal to and from each of the external ports, and receive and send a port block signal. An access conflict management circuit receives the address signals from the registers and buffers and generates the port block signal when an access conflict to a bank occurs. A bank column selector, arranged between the registers and buffers and the plurality of banks, receives the read/write signal and the address signal from the registers and buffers and the data signal from the registers and buffers or the plurality of banks, generates a bank column selection signal based on the address signal to output it to the plurality of banks. A bank row selector receives the address signal from the registers and buffers and generates a bank row selection signal based on the address signal to output it to the plurality of banks selected by the bank row selection signal among the plurality of banks. The port transition circuit activates a bank among the plurality of banks based on the bank column selection signal and bank row selection signal when no port block signal is outputted by the access conflict management circuit.

In a second aspect of the invention, a synchronous crossbar multi-port bank memory has a plurality of banks including a plurality of 1-port memory cells. A clock generator generates an internal clock signal and sends the internal clock signal to the plurality of banks. Registers and buffers receive a read/write signal and an address signal from each of external ports, receive and send a data signal to and from each of the external ports, and receive and send a port block signal. An access conflict management circuit receives the address signals from the registers and buffers and generates the port block signal when an access conflict occurs. A crossbar switching network is provided between the registers and buffers and the plurality of banks. The crossbar switching network performs switching at cross points at a plurality of nodes, each of the nodes being located between a line connected to the ports and signal lines from the banks. The crossbar switching network receives the read/write signal and the address signal from the registers and buffers and the data signal from the registers and buffers or the plurality of banks, activates one of the cross points based on the address signal when no port block signal is outputted by the access conflict management circuit.

In a third aspect of the invention, a synchronous distributed crossbar multi-port bank memory has a plurality of banks including a plurality of 1-port memory cells. A clock generator generates an internal clock signal and sends the internal clock signal to the plurality of banks. Registers and buffers receive a read/write signal and an address signal from each of external ports, receive and send a data signal to and from each of the external ports, and receive and send a port block signal. An access conflict management circuit receives the address signals from the registers and buffers and generates the port block signal when an access conflict occurs. A plurality of crossbar switching networks provided between the registers and buffers and a plurality of clusters into which the plurality of banks are divided, wherein each of the plurality of crossbar switching networks performs switching at cross points at nodes, each of the nodes being located between lines connected to the ports and a signal line from each bank in a cluster. Each of the crossbar switching networks receives the read/write signal and the address signal from the registers and buffers and the data signal from the registers and buffers or the plurality of banks, activates a cross point based on the address signal when no port block signal is outputted by the access conflict management circuit.

In a fourth aspect of the invention, a synchronous 1-port bank memory has a plurality of banks including a plurality of 1-port memory cells. A clock generator generates an internal clock signal and sends the internal clock signal to the plurality of banks. Registers and buffers receive a read/write signal and an address signal from each of external ports, receive and send a data signal to and from each of the external ports, and receive and send a port block signal. An access conflict management circuit receives the address signals from the registers and buffers and generates the port block signal when an access conflict occurs. A network is provided between the registers and buffers and the plurality of banks. The network receives the read/write signal and the address signal from the registers and buffers and the data signal from the registers and buffers or the plurality of banks, generates a bank selection signal when no port block signal is outputted by the access conflict management circuit, and activates the bank selected by the bank selection signal.

In a fifth aspect of the invention, a synchronous bank memory has a plurality of banks including a plurality of 1-port memory cells. A clock generator generates an internal clock signal and sends the internal clock signal to the plurality of banks. Registers and buffers receive a read/write signal and an address signal from external ports, receive and send a data signal to and from external ports, and receive and send a port block signal. A network is provided between the registers and buffers and the plurality of banks. The network receives the read/write signal and the address signal from the registers and buffers, generates a bank selection signal to activate the bank selected by the bank selection signal. The fifth aspect is general and includes the first to fourth aspects of the invention.

In a sixth aspect of the invention, a synchronous multi-port bank memory is accessed as mentioned below. The synchronous bank memory includes a plurality of banks each including a plurality of 1-port memory cells, a clock generator which generates an internal clock signal and sends the internal clock signal to the plurality of banks, registers and buffers which receive a read/write signal and an address signal from each of the external ports, receive and send a data signal to and from each of the external ports, and a switching network provided between the registers and buffers and the plurality of banks. When a clock cycle is started, the registers and buffers send the read/write signal and the address signal to the switching network and send the address signals to the access conflict management circuit. The switching network generates a bank selection signal when a port block signal is not received from the access conflict management circuit. A bank in the plurality of banks, all of which are in precharged state for read/write operation, is selected by the bank selection signal. Further, when the selected bank receives an internal clock signal from the clock generator, a memory cell in the bank is accessed, and if read is instructed, the read data is sent to the port.

In a seventh aspect of the invention, a synchronous 1-port bank memory is accessed as mentioned below. The synchronous bank memory includes a plurality of banks each including a plurality of 1-port memory cells, a clock generator which generates an internal clock signal, registers and buffers which receive a read/write signal and an address signal from an external port, receive and send a data signal to and from the external port, and a switching network provided between the registers and buffers and the plurality of banks. When a clock cycle is started, the registers and buffers send the read/write signal and the address signal to the switching network. The switching network generates a bank selection signal. When the bank selection signal is received, a bank, being in precharged state for read/write operation, is selected by the bank selection signal. Further, when the selected bank receives an internal clock signal from the clock generator, a memory cell in the bank is accessed, and if read is instructed, the data is sent to the port.

An advantage of the present invention is that memory access cycle time can be shortened and power dissipation can be reduced in various synchronous bank memories such as HMA memory, crossbar memory and distributed crossbar memory, both for multi-port memories and for 1-port memories.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1:
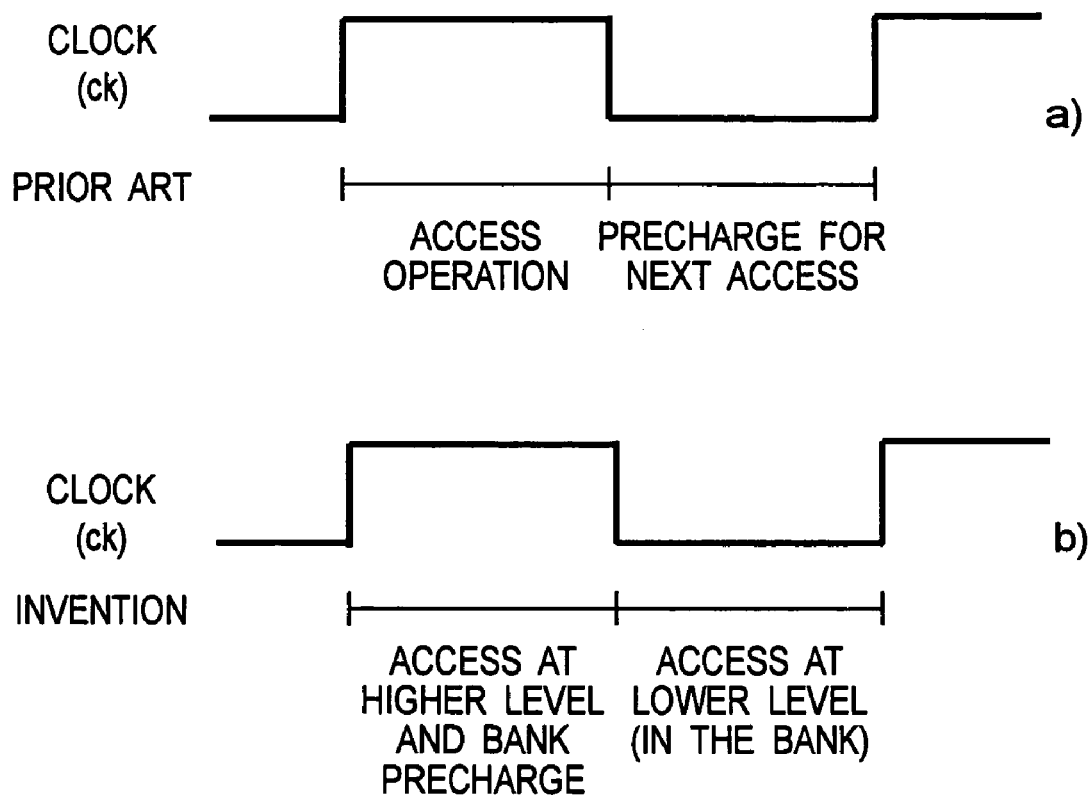
FIG. 1 is a diagram for explaining an access to a bank-type memory.

Referring now to the drawings, wherein like reference characters designate like or corresponding parts throughout the several views, embodiments of the inventions are explained.

(A) New Approach to Access for a Synchronous Bank Memory

In a multi-port bank memory, many 1-port memories called as banks are arranged and connected to a plurality of ports. In order to minimize access time in a conventional multi-port bank memory, bit lines are precharged to a suitable voltage, before a sense amplifier is activated in a bank.

Access to a synchronous bank memory according to the invention is explained below. When a clock cycle is started, as shown in FIG. 1(b), in a first half of the clock cycle (ck="1"), access just up to a word line driver in a bank for a read/write operation as well as precharging for the bit lines in the bank to a suitable voltage are performed at the same time. That is, a memory access time is overlapped partly with a period for the precharging. In a second half of the clock cycle (ck="0"), word lines are activated in the bank for access following the access in the first half (access at lower level in the bank) Because a part of the memory access time is overlapped with the precharging period, the access cycle time in the memory can be shortened effectively. This access approach can be applied to any bank memory operated synchronously with a clock signal.

Though the access at lower level in the bank is performed at the second half of the clock cycle in the above-mentioned example, it is desirable in some cases to delay the access. Then, the bank may be accessed more generally with an internal clock signal generated at an appropriate timing relative to the start of a clock cycle. In this sense, though an internal clock generator generates an inverted clock signal ckq in various embodiments to be explained later, the internal clock signal is not limited to the inverted clock signal ckq.

Figure 2:
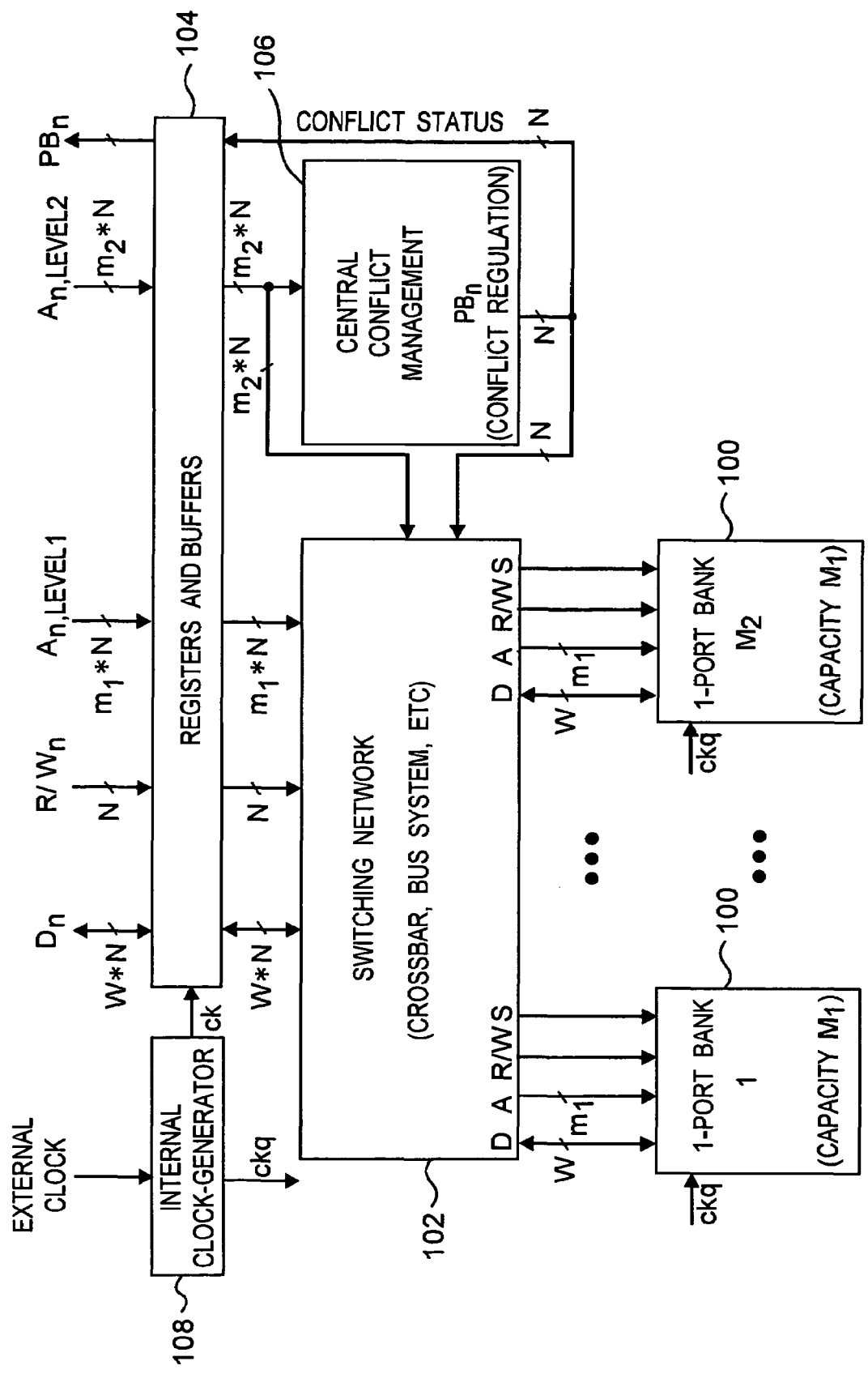
FIG. 2 is a diagram for explaining a concept of multi-port bank memory.

First, an application to a multi-port bank memory is explained. FIG. 2 shows a concept of a multi-port bank memory which includes many bank structures having 1-port banks 100 and a switching network 102 connecting them to a plurality of ports.

The 1-port memory banks 100 are arranged in a two-dimensional matrix. Each 1-port memory bank 100 consists of conventional 1-port memory cells (including dynamic random access memory (DRAM) cells and static random access memory (SRAM) cells). A 1-port memory bank 100 has an area for 1-port memory cells arranged in a matrix, a column selector and a read/write circuit and a row selector. Further, it includes a word line driver and a sense amplifier for the area for 1-port memory cells (not shown). A 1-port memory cell is connected to a word line and a pair of bit lines. When a lower address (address for a 1-port memory cell) and data are inputted to a 1-port bank 100, a corresponding memory cell is selected, and a read/write operation is performed according to a read/write signal.

When a clock cycle is started, registers/buffers 104 receive address signal "A", data signal "D", read/write signal R/W and sends a port block signal PB to the external. (The suffix "n" of the signal names means that the signals are sent to or received from the n-th port.) The switching network 102 has port transition circuits for transition between 1-port and N-ports for address and for data, and a bank decoder which selects a bank based on an higher address signal. The switching network 102 generates a bank selection signal S based on a signal received from the registers/buffers 104, sends address signal "A", read/write signal R/W and bank selection signal "S" to the 1-port bank 100 and reads data D from or writes data D to the bank 100 according to the read/write signal R/W. Further, an access conflict management circuit 106 generates a port block signal PB when it decides that an access conflict condition happens based on access information from the registers/buffers 104, and sends the port block signal PB to the switching network 102 and registers/buffers 104. Further, an internal clock generator 108 generates an inverted clock signal ckq of the external clock signal ck as an internal clock signal, sends the clock signal ck to the registers/buffers 104 and the clock signals ck and ckq to the banks 104. (In this specification, "q" at the last of a signal name represents a negative logic signal.)

The switching network 102 has a various structure, classified largely into completely non-blocking networks wherein access conflict conditions do not occur outside the banks, and blocking networks wherein access conflict conditions may occur outside the banks. The access approach of the invention can be applied to both types of the switching network 102. Further, it can be applied to two types of multi-port bank memory architectures of hierarchical memory architecture and crossbar memory architecture, and to a distributed crossbar architecture and an architecture having a network other than a crossbar. The examples will be explained below.

Figure 3:
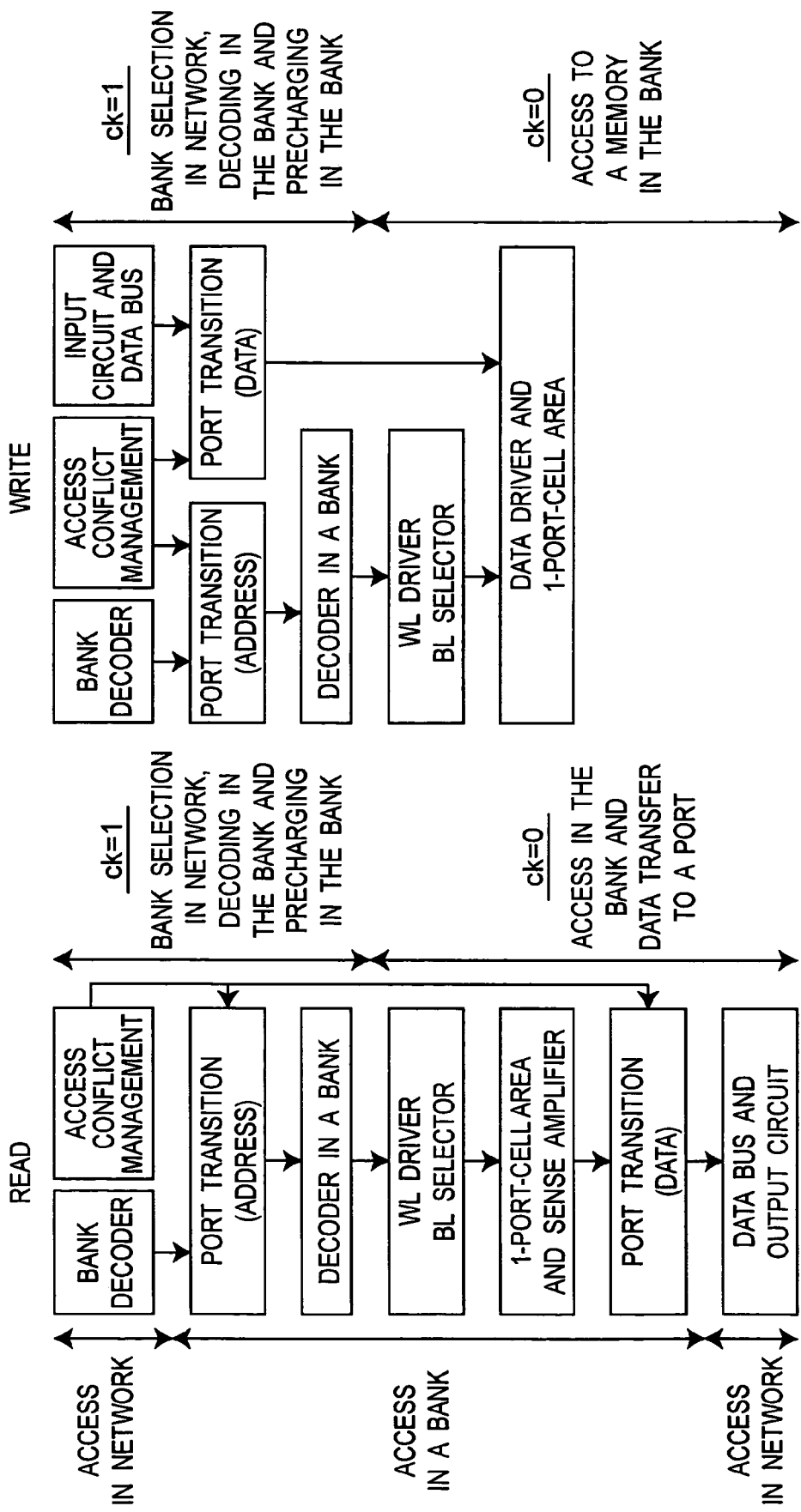
FIG. 3 is a diagram on read and write operations according to the invention in a general bank memory.

FIG. 3 shows read and write operations according to the invention in the general bank memory shown in FIG. 2. A part of access time is hidden by access arbitration and port/bank selection performed simultaneously with the precharging for the bank. Then, the memory access cycle time can be shortened.

In the case of read, in the first half of a clock cycle (ck="1"), a bank 100 is selected in the switching network 102, decoding is performed in the bank 100 and the precharging is performed for the bank 100. That is, an input signal is sent in parallel to the switching network 102 and to the registers/buffers 104. The bank decoding and 1-to-N-port transition is performed in the switching network 102, and the decoder is operated in the bank 100.

Next, in the second half of the clock cycle (ck="0"), access (read) is performed in the bank 100, and the data is sent to the port 100. In the bank 100, the word line is activated according to clock signal ckq by the word line driver, and the bit line selector and the sense amplifier for the 1-port cell area are activated. A data read from the memory cell is sent through the port transition circuit (for data), the data bus, and an output circuit in the registers/buffers 104 to an external port.

In the case of write, when a clock signal is supplied, in the first half of a clock cycle (ck="1"), bank selection in the switching network 102 and decoding and precharging in the bank 100 are performed, similarly to the case of read. Further, the data to be written is sent through the registers/buffers 104 and the 1-to-N-port transition circuit (for data) to the bank 100.

Next, in the second half of the clock cycle (ck="0"), the word line driver is activated in the bank for access to the bank 100 to write the data to the 1-port cell area.

So far, a multi-port bank memory is explained above. However, a 1-port bank memory is also realizable by using a switching network as shown in FIG. 1, but in this case the switching network does not need a port-transition function. (In order to avoid iteration of the explanation, the description and drawings therefor are omitted here.) Therefore, the access technique according to the invention can also be applied to a 1-port bank memory. Further, needless to say, the conflict management circuit 106 is omitted for the 1-port bank memory. Therefore, a general 1-port bank memory consists of a plurality of banks each having 1-port memory cells, similarly to an N-port bank memory. When a register receives an internal clock signal generated by a clock generator, it receives or sends a read/write signal, an address signal and a data signal from or to an external port. A network circuit is provided between the register and the banks. It receives a read/write signal and an address signal from the register to generate a bank selection signal to active the selected bank and sends the clock signal received from the clock generator to the bank. Thus, the synchronous bank memory includes a plurality of banks each including a plurality of 1-port memory cells, a clock generator which generates an internal clock signal, registers and buffers which receive a read/write signal and an address signal from an external port, receive and send a data signal to and from the external port, and a switching network provided between the registers and buffers and the plurality of banks. The synchronous 1-port bank memory is accessed as follows. When a clock cycle is started, the registers and buffers send the read/write signal and the address signal to the switching network. The switching network generates a bank selection signal. When the bank selection signal is received, a bank, being in precharged state for read/write operation, is selected by the bank selection signal. Further, when the selected bank receives an internal clock signal from the clock generator, a memory cell in the bank is accessed, and if read is instructed, the data is sent to the port.

(B) Application to a Synchronous Hierarchical Multi-Port Memory Architecture

Figure 5:
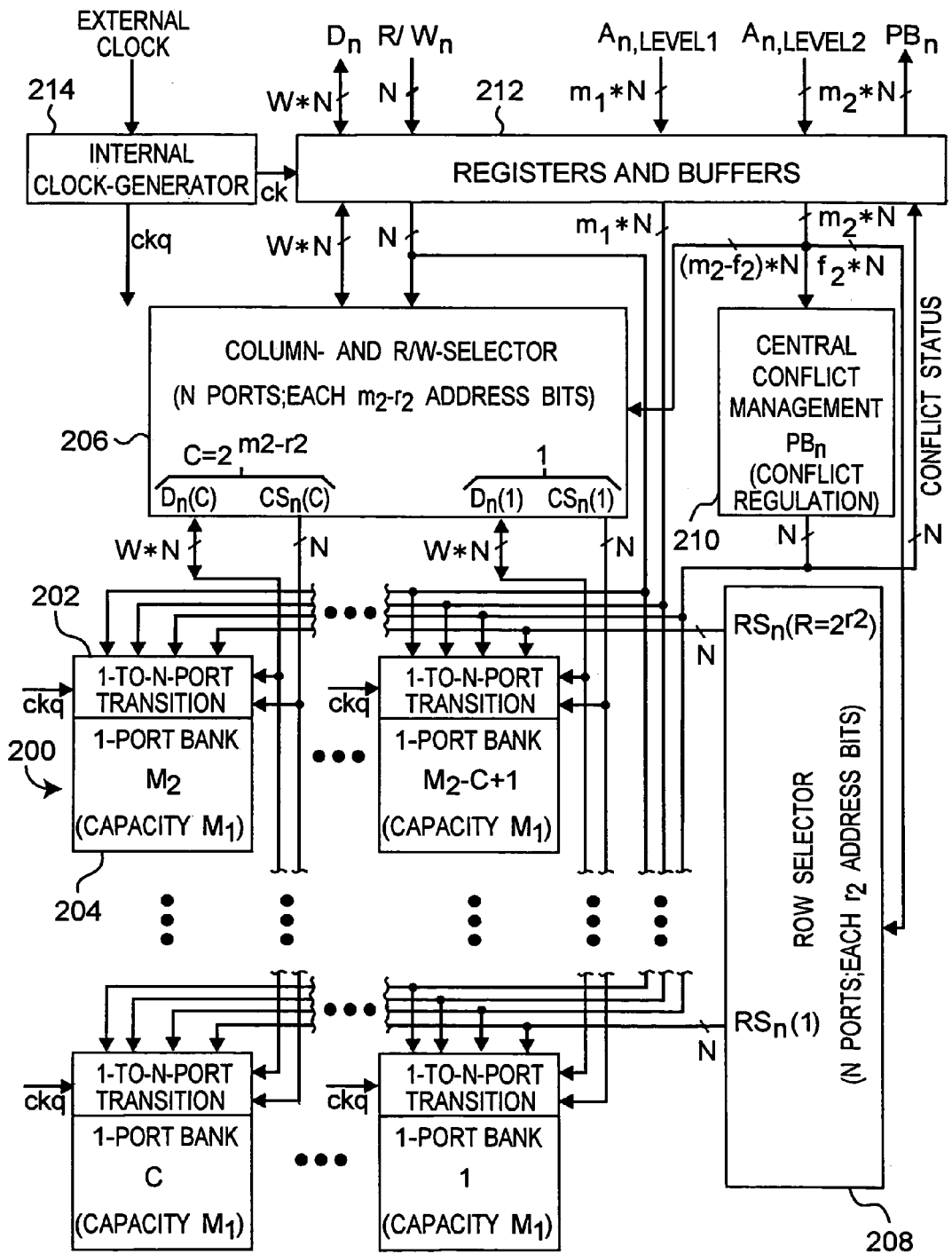
FIG. 5 is a diagram of an HMA memory with static CMOS gates.

A synchronous hierarchical multi-port memory architecture (hereinafter referred to as HMA) is a multi-port memory architecture having a non-blocking network (H. J. Mattausch, Koji Kishi and Takayuki Gyohten, "Area-efficient multi-port SRAMs for on-chip data-storage with high random-access bandwidth and large storage capacity," IEICE Transactions on Electronics, Vol. E84-C, No. 3, p. 410, 2001). FIG. 5 shows a structure of an HMA memory with static CMOS gates. The HMA memory has first layer modules 200, a bank column selector 206, a bank row selector 208 and a central conflict management circuit 210. A first layer module 200 includes a 1-to-N-port transition circuit 202 between 1-port and N-ports and 1-port banks 204. The 1-port bank 204 has a 1-port memory cell area, a column selector/read-and-write selector, and a row selector, and, similarly to the 1-port bank shown in FIG. 2, includes a word line driver and a sense amplifier for the 1-port memory cell area. The first layer modules 200 are arranged in a two-dimensional matrix wherein 1-port memory cells are contained. A bank column selector 206 and a bank row selector 208 generate bank selection signals CS and RS to select a bank in the column direction and in the row direction, respectively. Further, an internal clock generator 214 generates internal clock signals ck, ckq based on the global clock signal and sends them to the registers/buffers 212, central conflict management circuit 210 and first layer modules 200. The registers/buffers 212 receive address signal A, data signal D and read/write signal R/W from an external port (port number n=1, 2, . . . , N) and sends higher bits of the address signal on the bank address to the central conflict management circuit 210. Further, the registers/buffers 212 send the read/write signal to the first layer modules 200.

The bank row selection signal $RS_n$ and column selection signal $CS_n$ generated by the bank row selector 208 and bank column selector 206 are obtained by decoding higher $m_2$ bits in the address received from each port in correspondence to the bank address. A bank 204 is selected by both of $RS_n$ and $CS_n$ to read/write data $D_n$ of the port n, where n denotes a port number. The data $D_n$ is read or written from or to the bank according to the read/write signal R/W.

Because access to the same bank in the same cycle is limited to one port, access conflict condition happens when a plurality of ports access the same bank simultaneously. The central conflict management circuit 210 compares bank addresses from the ports, and if it decides that a conflict condition happens, it sends a port block signal $PB_n$ through the registers/buffers 212 to the external ports.

Inside the bank column selector 206, buffers ($D_n(1)$, $D_n(2)$, . . . , $D_n(C)$) for sending data are provided for each column. Then, gate/line capacitance on the buffer $D_n$ is decreased, and this enhances the processing speed in the bank column selector 206. Further, by driving the only one driver for the selected bank column, the power dissipation can be decreased efficiently.

Characteristics of the architecture of the HMA memory are that the output signal $PB_n$ of the central conflict management circuit 210 is sent to the 1-to-N-port transition circuit 202, and that the inverted clock signal ckq is also sent to the transition circuit 202. Because the output signal $PB_n$ is received by the transition circuit 202, the bank selection and the access conflict management can be processed in parallel, and this is advantageous for high speed processing. Further, by generating bank-internal clock signal $CK_{int}$ based on the inverted clock signal ckq, only one decoder in the selected bank is activated, so that the power dissipation can be decreased effectively.

Figure 4:
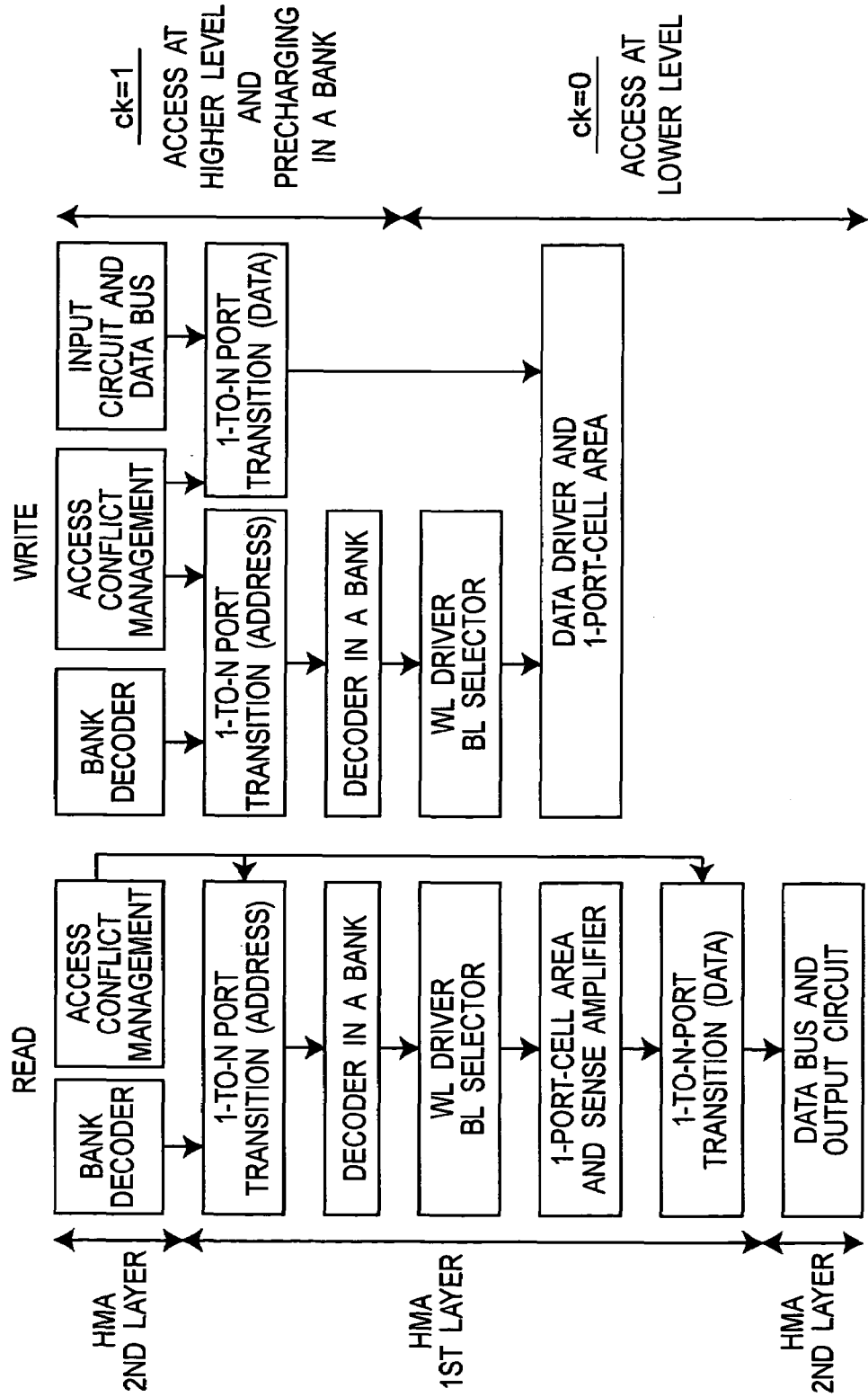
FIG. 4 is a diagram on read and write operations in an HMA memory with an access technique of the invention.

FIG. 4 shows read and write operations in an HMA memory according to access process of the invention. A part of the access time for a multi-port memory is concealed by overlapping the precharging in the bank with the arbitration of access conflict and the selection of bank and port. Thus, memory access cycle time can be shortened.

In the case of read, when a clock signal is supplied, in the first half of a clock cycle (ck="1"), a bank is selected in the bank row selector 208 and bank column selector 206, the decoding is performed in the first layer module 200, and precharging is performed in a 1-port bank 204. That is, input signals to the registers/buffers 212 are sent to the bank row selector 208, to the bank column selector 206 and to the arbiter 210 in parallel, the bank decoding is performed in the bank row selector 208 and bank column selector 206, and the port transition (for address) is performed in the 1-to-N-port transition circuit. Further, a decoder is operated in the 1-port bank 204.

Next, in the second half of the clock cycle (ck="0"), access (read) in the 1-port bank 204 and data transmission to the port is performed. In the 1-port bank 204, the word line driver activates the word line, and bit line selector and sense amplifier are also activated. The data read from a memory cell is sent to the external port through the 1-to-N-port transition circuit (for data) 202, the data bus, the bank column selector 206 and an output circuit in the registers/buffers 212.

In the case of write, when a clock signal is supplied, in the first half of a clock cycle (ck="1"), the bank is selected in the bank row selector 208 and the bank column selector 206, the decoding is performed in the first layer module 200, and the precharging is performed in the 1-port bank 204, similarly to the case of read. Further, the data written to the memory cell is sent to the 1-port bank 204 through the registers/buffers 212, the bank column selector 206, and the transition circuit (data) 202 between 1 port and N ports.

Next, in the second half of the clock cycle (ck="0"), access (write) to the 1-port bank 204 is performed. That is, in the 1-port bank 204, the data driver is activated to write the data to the 1-port cell area.

Figure 6:
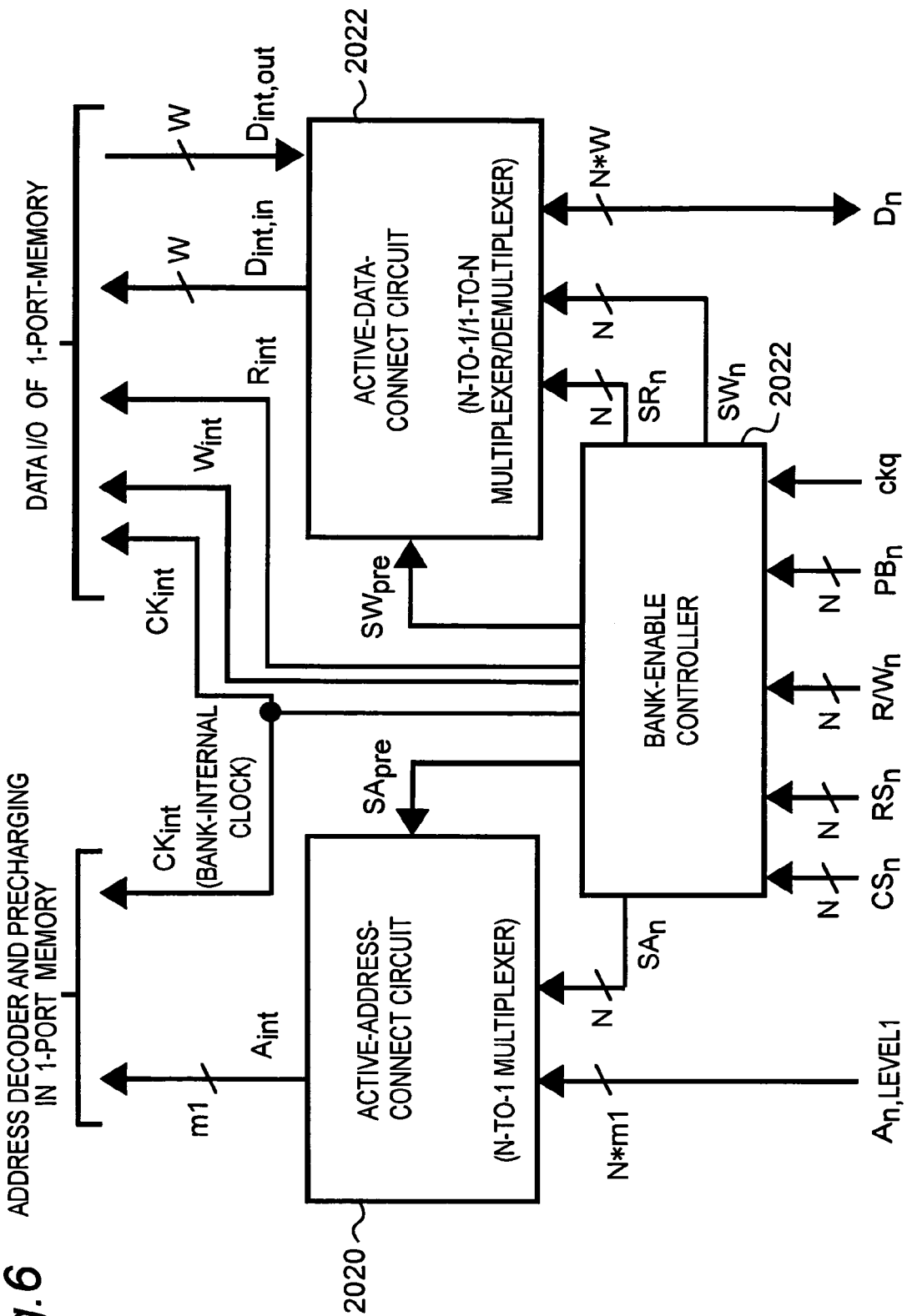
FIG. 6 is a block diagram of a 1-to-N-port transition circuit with static CMOS gates.

Next, the transition circuit 202 for transition between 1 port and N ports is explained. As shown in FIG. 6, it has an active-address-connect circuit 2020 for address switching, an active-data-connect circuit 2022 for data switching and a bank-enable controller 2024 for controlling them. The bank-enable controller 2024 receives inverted clock signal ckq and port block signal $PB_n$.

Figure 7:
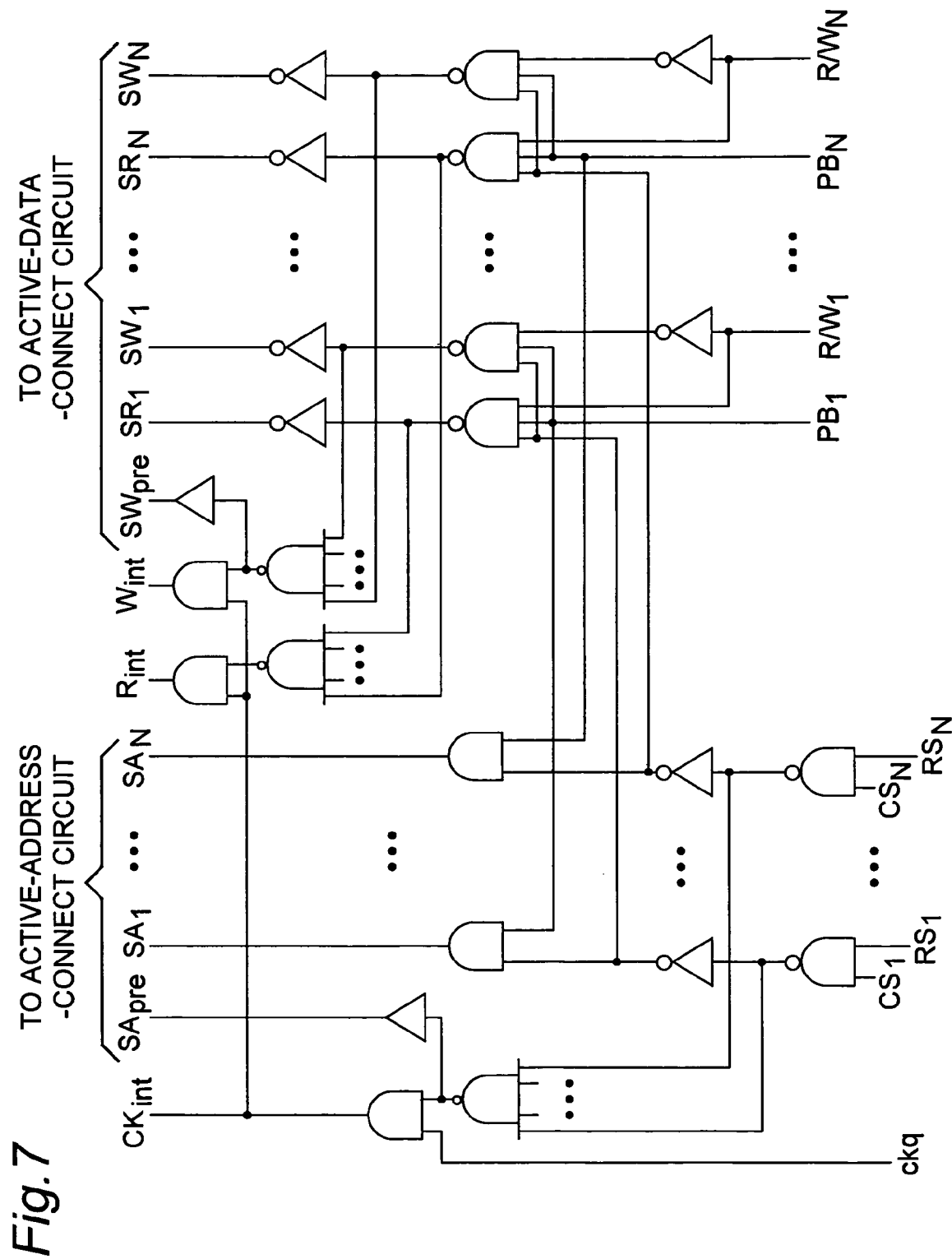
FIG. 7 is a circuit diagram of a bank-enable controller circuit with static CMOS gates.

As shown in FIG. 7, the bank-enable controller 2024 generates address switch enable signal $SA_n$ and precharge control signal $SA_{pre}$ for address lines in the active-address-connect circuit 2020, according to read/write signal $R/W_n$, row and column selection signals $RS_n$, $CS_n$ and port block signal $PB_n$ for each port, and sends the generated signals to the active-address-connect circuit 2020. Further, it generates read access enable signal $SR_n$, write access enable signal $SW_n$ and precharge control signal $SW_{pre}$ for data lines in the active-data-connect circuit 2022, and sends the generated signals to the active-data-connect circuit 2022. Still further, it generates read enable signal $R_{int}$, write enable signal $W_{int}$ and control clock signal $CK_{int}$ in the bank. Characteristics of the bank-enable controller 2024 are that the port block signal $PB_n$ is taken into account to generate the various signals and that the control clock signal $CK_{int}$ in the bank, for controlling bank-internal bit-line precharge and decoder, is generated based on the inverted clock signal ckq.

When both of the row and column selection signals $RA_n$ and $CS_n$ and the port block signal $PB_n$ of port n are "1", the address switch enable signal $SA_n$ is outputted to activate the active-address-connect circuit 2020, active-data-connect circuit 2022, and the bit line decoder, word line decoder and read/write unit in the bank. Otherwise, all switch enable signals $SA_n$ are "0", and all the circuits in the bank are disabled. The precharge control signal $SA_{pre}$ is outputted when the respective bank is selected for any one of the ports n (or when both row and column selection signals $RA_n$ and $CS_n$ are "1") and stops precharging of the address lines in the active-address-connect circuit 2020.

The read access enable signal $SR_n$ or write access enable signal $SW_n$ is outputted according to read/write signal $R/W_n$ when the respective bank 204 is selected. The precharge control signal $SW_{pre}$ is also outputted when the respective bank is selected for switching and stops precharging of the data lines in the active-data-connect circuit 2022.

The control clock signal $CK_{int}$ is the inverted clock signal ckq outputted when one of the banks 204 is selected. Further, the read enable signal $R_{int}$ and write enable signal $W_{int}$ are outputted when the read access enable signal $SR_n$ or write access enable signal $SW_n$ and the control clock signal $CK_{int}$ in the bank are outputted. Because the output $PB_n$ of the central conflict management circuit (arbiter) 210 is sent to the 1-to-N-port transition circuit 202, the bank selection and the arbitration of access conflicts can be processed in parallel, and this is advantageous for high speed operation. Further, by generating the clock signal $CK_{int}$ in the bank based on the inverted clock signal ckq, a decoder only in the selected bank is activated, and the precharging only in the selected bank is stopped, and this is advantageous for lower power dissipation.

Figure 8:
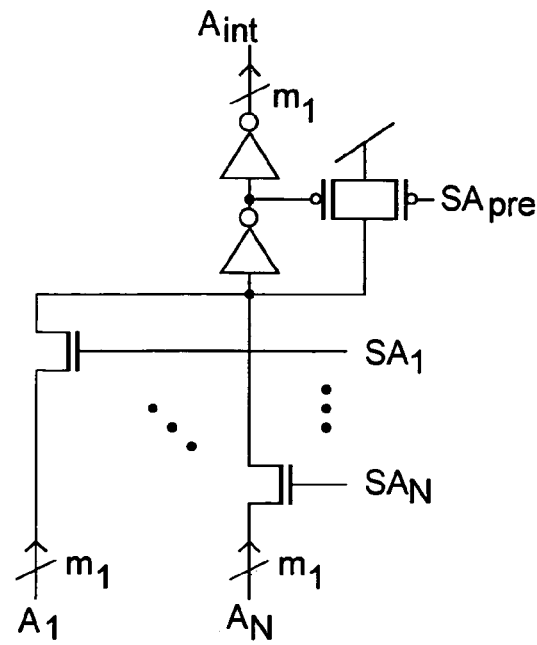
FIG. 8 is a circuit diagram of an active-address-connect circuit with static CMOS gates.

As shown in FIG. 8, the active-address-connect circuit 2020 sends the address $A_n$ of a port n, to which the address switch enable signal $SA_n$ enables access, to the word line decoder and bit line selector in the bank. It has NMOS transmission gates with a small area as a switch controlled with address switch enable signal $SA_n$ to output a signal to be sent through a global wiring (second layer) to the bank. Thus, the capacitance of the global wiring can be decreased, and this is advantageous for higher speed operation and for lower power dissipation. Further, two inverters connected in series and two PMOS transistors, one operated with the signal after the first inverter and the other operated with the precharge control signal $SA_{pre}$ are provided as a keeper a precharge circuit at the side of the bank.

Figure 9:
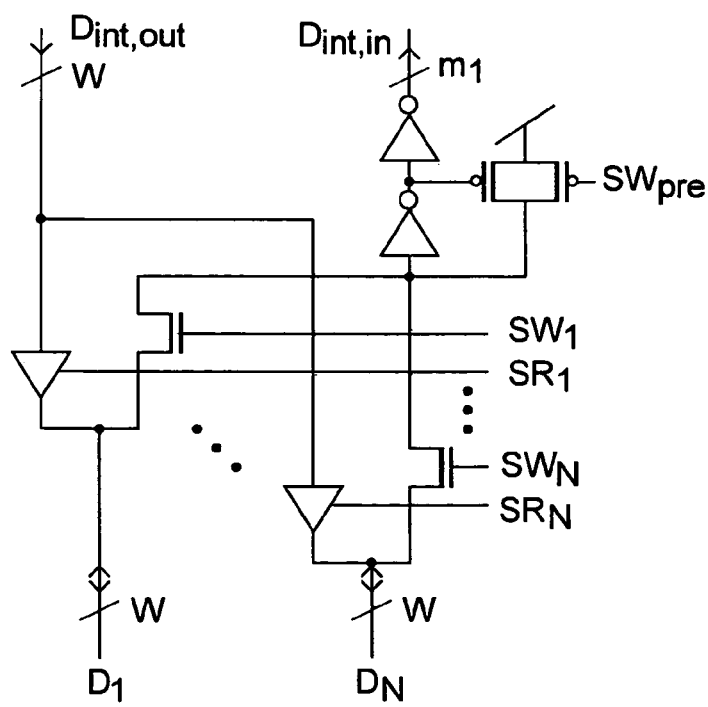
FIG. 9 is a circuit diagram of an active-data-connect circuit with static CMOS gates.

Similarly, the active-data-connect circuit 2022 shown in FIG. 9 receives read access enable signal $SR_n$ and write access enable signal $SW_n$ for each port n to connect the data signal line $D_{int,out}$ or $D_{int,in}$ to the data line $D_n$ of the port n o which access is enabled. When data is written, an NMOS transmission gate of small area is operated according to the write access enable signal $SW_n$. Further, two inverters connected in series and two PMOS transistors, one operated with the signal after the first inverter and the other operated according to the precharge control signal $SW_{pre}$, are provided as a keeper and a precharge circuit at the side of data signal line $D_{int,in}$ (or data read) in the bank. When data is outputted, a tri-state buffer is operated according to the write access enable signal $SW_n$ to connect the data signal line $D_{int,out}$ in the bank to the data line of the port. As mentioned above, a section for data write is separated from that for data read.

Figure 10:
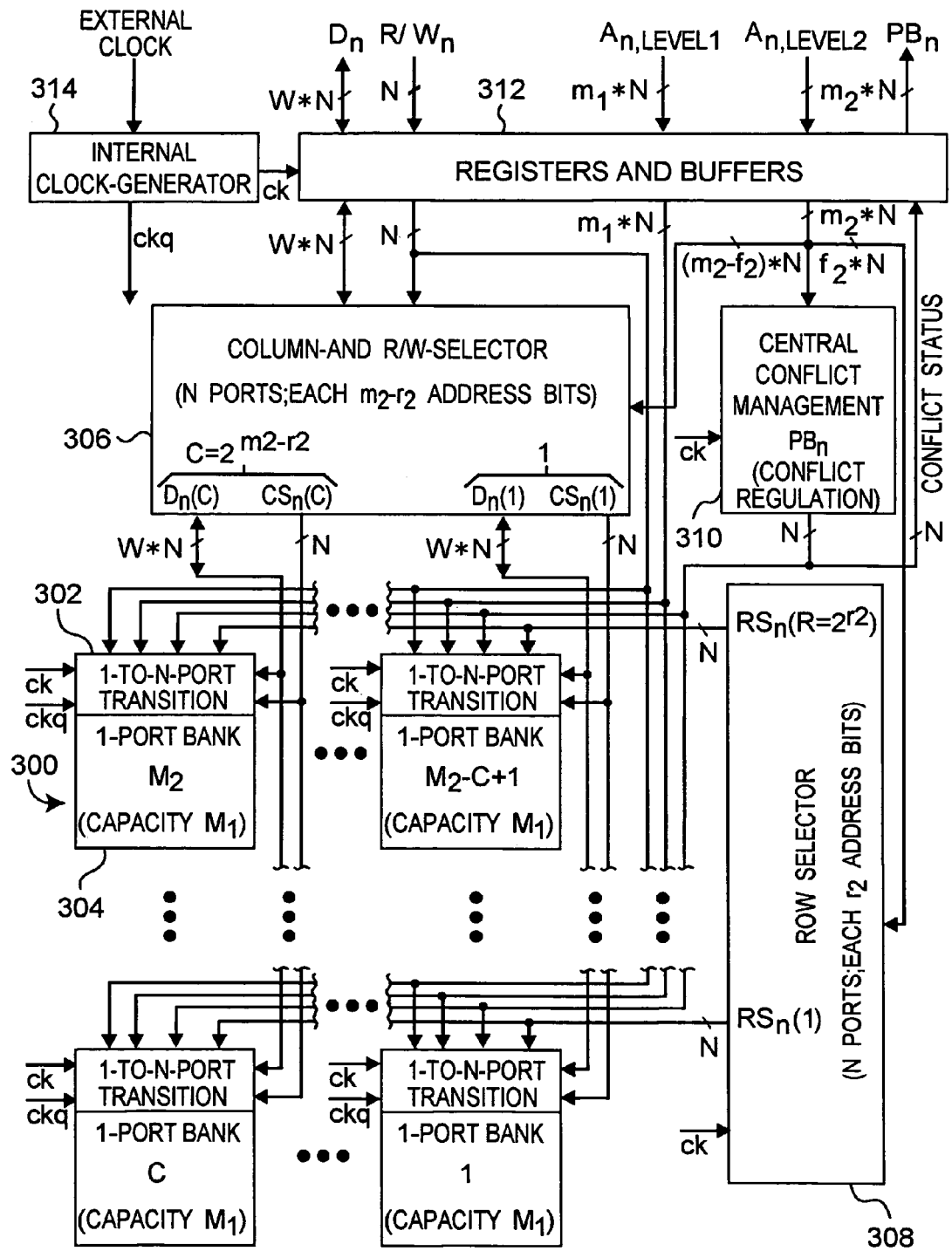
FIG. 10 is a diagram for showing HMA with dynamic CMOS gates.

FIG. 10 shows a synchronous HMA memory with dynamic CMOS gates. Dynamic CMOS gates are used to operate a synchronous circuit at a higher speed in a high performance circuit. A difference thereof from the circuit with static CMOS gates (FIG. 5) is that global clock signal ck is received by a central conflict management circuit 310 and a 1-to-N-port transition circuit 302 so that the dynamic circuits and the latches are controlled by the global clock signal.

An HMA memory with dynamic CMOS gates has first layer modules 300, a column bank selector 306, a row bank selector 308 and a central conflict management circuit 310, similarly to the HMA memory with static CMOS gates shown in FIG. 5. A first layer module 300 includes the transition circuit 302 between 1-port and N-ports (1-to-N-port transition circuit) and a 1-port bank 304. The first layer modules 300 are arranged in a two-dimensional matrix. The column bank selector 306 and the row bank selector 308 are used to select a bank in the column direction and in the row direction, respectively. Further, an internal clock generator 314 and registers/buffers 312 are provided. The internal clock generator 314 generates internal clock signals ck and ckq based on the global clock signal and sends them to the registers/buffers 314, the central conflict management circuit 310 and the first layer modules 300. The registers/buffers 312 receive address signal A, data signal D and read/write signal R/W from the external ports and send the signals D, R/W and an address port for bank address (higher bits) to the column bank selector 306. It also sends the part for bank address (higher bits) in the address signal A to the central conflict management circuit 310 and the row bank selector 308. The registers/buffers 312 send the read/write signal R/W and a part for bank-internal access (lower bits) in the address signal A to each of the first layer modules 300. The bank 304 in the first layer module 300 includes a word line driver, a bit line selector, a sense amplifier and 1-port memory cells. The row bank selector 308 and the column bank selector 306 generate a row bank selection signal $RS_n$ and a column bank selection signal $CS_n$ by decoding the higher bits of bank address ($m_2$ bits) in the address signal A received from each port. A bank 304 selected by the row and column bank selection signals $RS_n$ and $CS_n$ is accessed. The data D is read from or written to the bank 304 according to read/write signal R/W.

Figure 11:
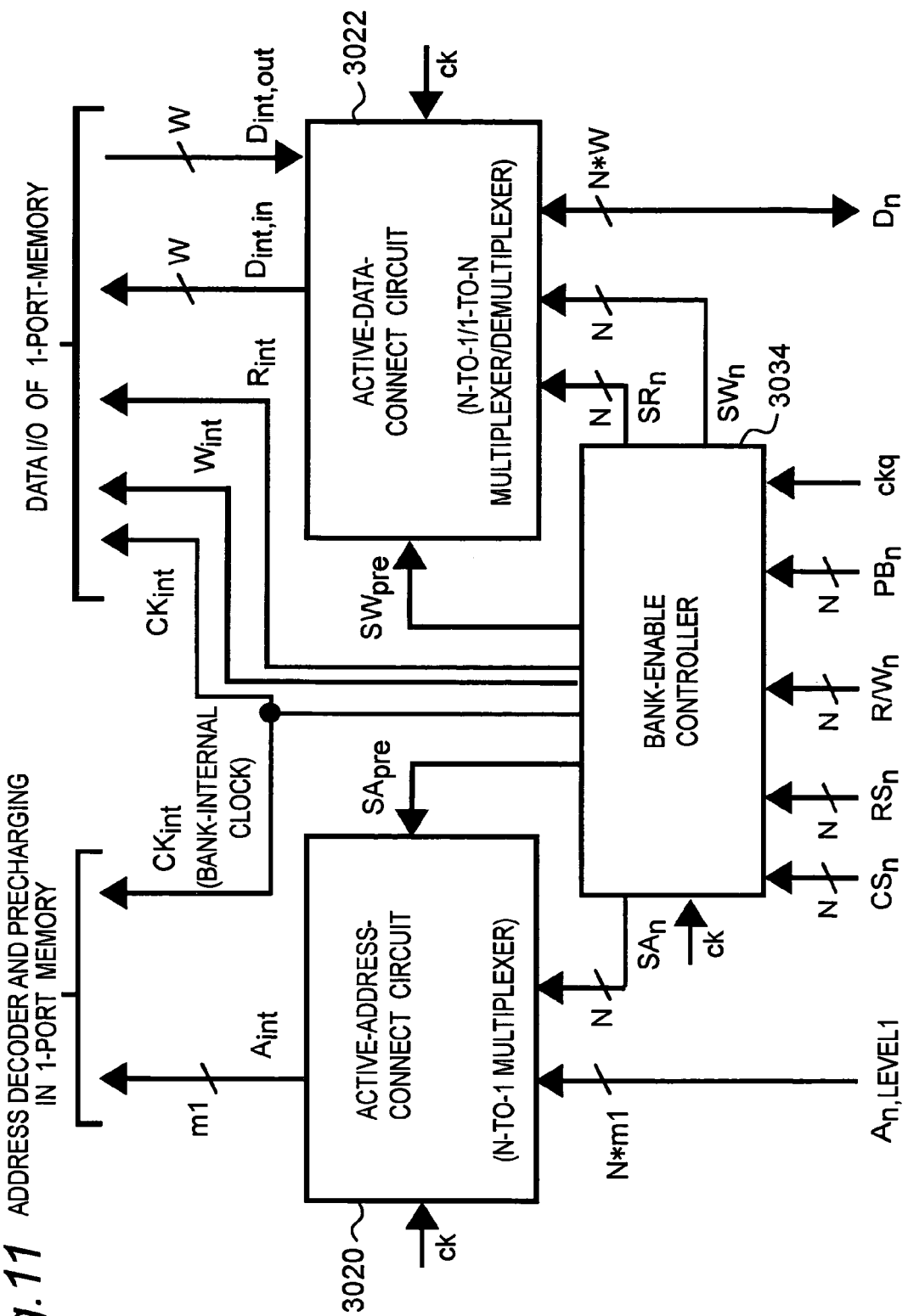
FIG. 11 is a block diagram of a 1-to-N-port transition circuit with dynamic CMOS gates.

FIG. 11 shows the 1-to-N-port transition circuit 302. It includes an active-address-connect circuit 3020 for switching an address, an active-data-connect circuit 3022 for switching a data, and a bank enable circuit 3024 for controlling them. This port transition circuit with dynamic CMOS gates is different from that transition circuit with static CMOS gates in that the global clock signal ck is inputted for controlling the dynamic circuits and the latch circuits. The bank enable circuit 3024 receives the global clock signal ck besides the inverted clock signal ckq and the port block signal $PB_n$. The active-address-connect circuit 3020 and the active-data-connect circuit 3022 receive the clock signal ck.

Figure 12:
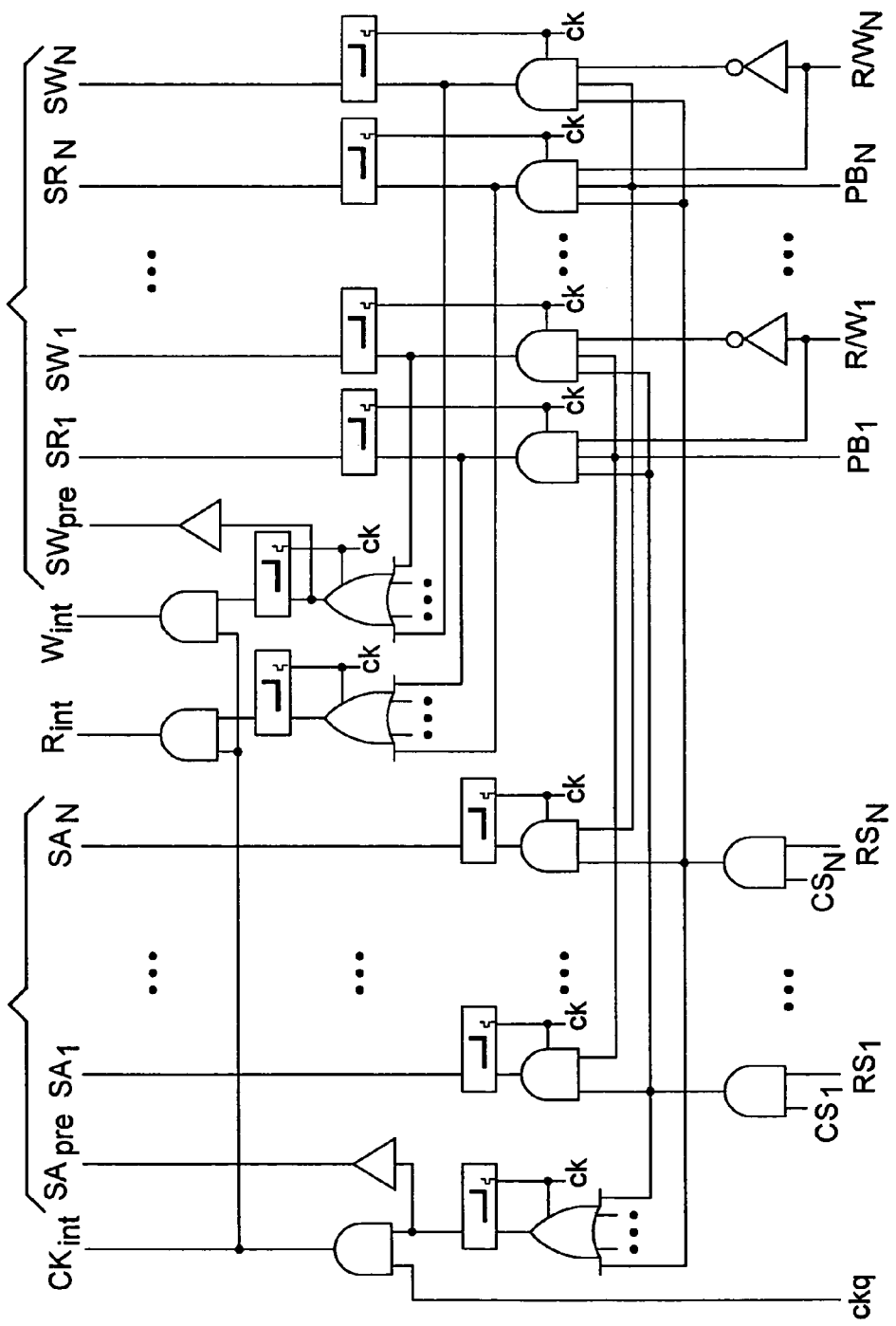
FIG. 12 is a circuit diagram of a bank-enable controller circuit with dynamic CMOS gates.

Similarly to the bank enable circuit 2024 shown in FIG. 7, the bank-enable controller 3024 shown in FIG. 12 generates address switch enable signal $SA_n$ and a precharge control signal $SA_{pre}$ for the address lines in the active-address-connect circuit 3020, based on read/write signal $R/W_n$, row and column selection signals $RS_n$, $CS_n$ and the port block signal $PB_n$ for each port, and sends the generated signals to the active-address-connect circuit 3020. Further, it generates read access enable signal $SR_n$, write access enable signal $SW_n$, and precharge control signal $SW_{pre}$ for data lines in the active-data-connect circuit 3022, and sends the generated signals to the active-data-connect circuit 3022. Still further, it generates read enable signal $R_{int}$, write enable signal $W_{int}$, and control clock signal $CK_{int}$ in the bank. It is especially effective that a multi-input gate, such as a dynamic OR gate used in circuits for generating the read enable signal $R_{int}$ or write enable signal $W_{int}$, is fabricated as a dynamic CMOS gate.

Figure 13:
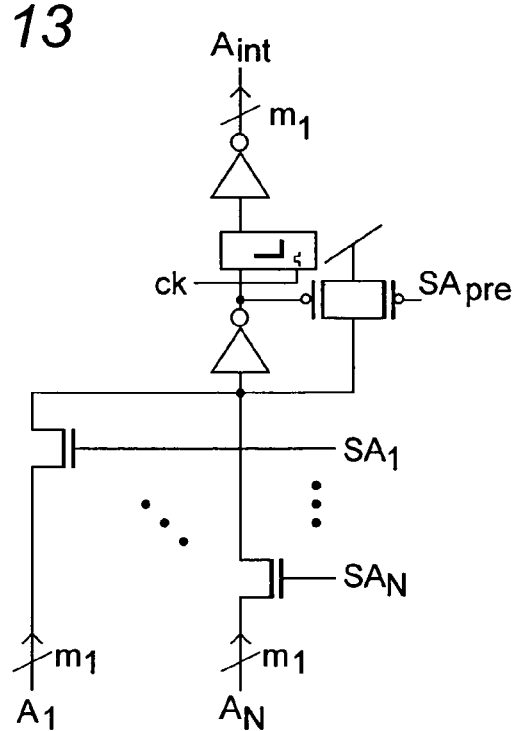
FIG. 13 is a circuit diagram of an active-address-connect circuit of a 1-to-N-port transition circuit with dynamic CMOS gates.

Similarly to the active-address-connect circuit 2020 shown in FIG. 8, the active-address-connect circuit 3020 shown in FIG. 13 sends an address of the port enabled with the address switch enable signal $SA_n$ to the word line decoder. The active-address-connect circuit 3020 has an NMOS transmission gate of a small area as a switch for controlling a signal to be sent from the global wiring (second layer) to a bank. Thus, the capacitance of the global wiring can be decreased, and this is advantageous for higher speed operation and for lower power dissipation. Further, for the precharge circuit, two inverters connected in series and two PMOS transistors, one operated with the signal after the first inverter and the other operated with the precharge control signal $SA_{pre}$, are provided at the side of the bank.

Figure 14:
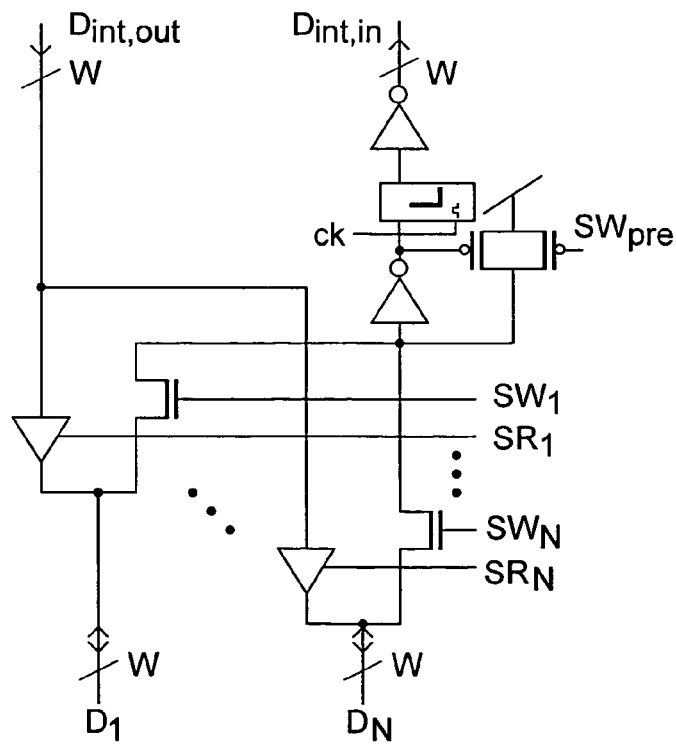
FIG. 14 is a circuit diagram of an active-data-connect circuit of a 1-to-N-port transition circuit with dynamic CMOS gates.

Similarly, the active-data-connect circuit 3022 shown in FIG. 14 receives read access enable signal $SR_n$ and write access enable signal $SW_n$ for each port to connect the data signal line $D_{int,out}$ or $D_{int,in}$ in the bank to the data line $D_n$ of the port to which access is enabled. A circuit for sending data to the 1-port memory is separated from a circuit for sending a data to a column selector. Similarly to the active-address-connect circuit 3020, the active-data-connect circuit 3022 has an NMOS transmission gate of a small area as a switch for controlling a signal to be sent from the global wiring (second layer) to a bank. Further, the precharge circuit and the latch circuits controlled with the external clock ck are provided at the side of data to be written.

A difference of these circuits from those shown in FIGS. 7–9 is that latch circuits are used. The latch circuit is operated with the clock signal ck to latch the data when the dynamic gate enters to a precharge period. Therefore, latch circuits can be set at positions selected rather freely, except that the position of a latch circuit depends on the positions of the dynamic gates (or a dynamic gate cannot be positioned in the downstream side of a latch). Based on the positions of the latch circuits, the processing to be overlapped in the precharge period of the banks is determined. It is to be noted that the number of the latch circuits and the electric power dissipation have a trade-off relationship between them.

(C) Application to a Synchronous Crossbar Multi-Port Memory

A memory using a crossbar switching network for the switching network 102 in the multi-port memory shown in FIG. 2 is called as crossbar multi-port memory. The crossbar switching network is a non-blocking network, and access conflict does not occur outside the bank.

Figure 15:
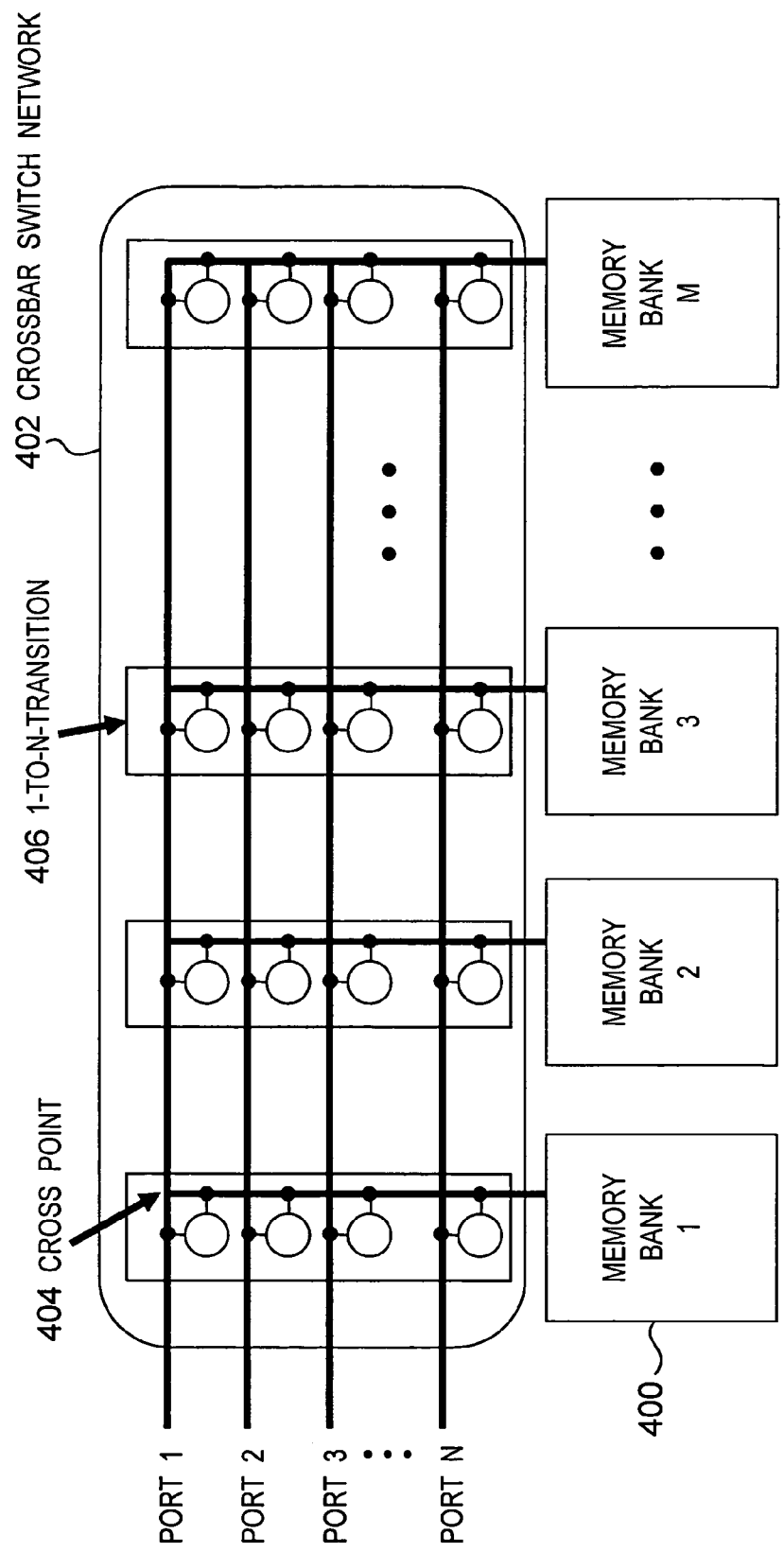
FIG. 15 is a diagram for showing a concept of a crossbar multi-port memory.

FIG. 15 shows a structure of a crossbar multi-port memory. A plurality of 1-port banks 400 are connected through a crossbar switching network 402 to one of N ports. A cross point in a crossbar switching network 402 is a circuit for switching between the ports and the banks 400, so that the number thereof is equal to the number of the ports for each bank. Further a portion 406 including cross points for a 1-port bank 400 performs transition between a port and N ports, similarly to the 1-to-N-port transition circuit in the HMA memory. Further, similarly to the multi-port memory shown in FIG. 2, buffers, a conflict management circuit and an internal clock generator (not shown) are provided for the functions mentioned above.

Figure 16:
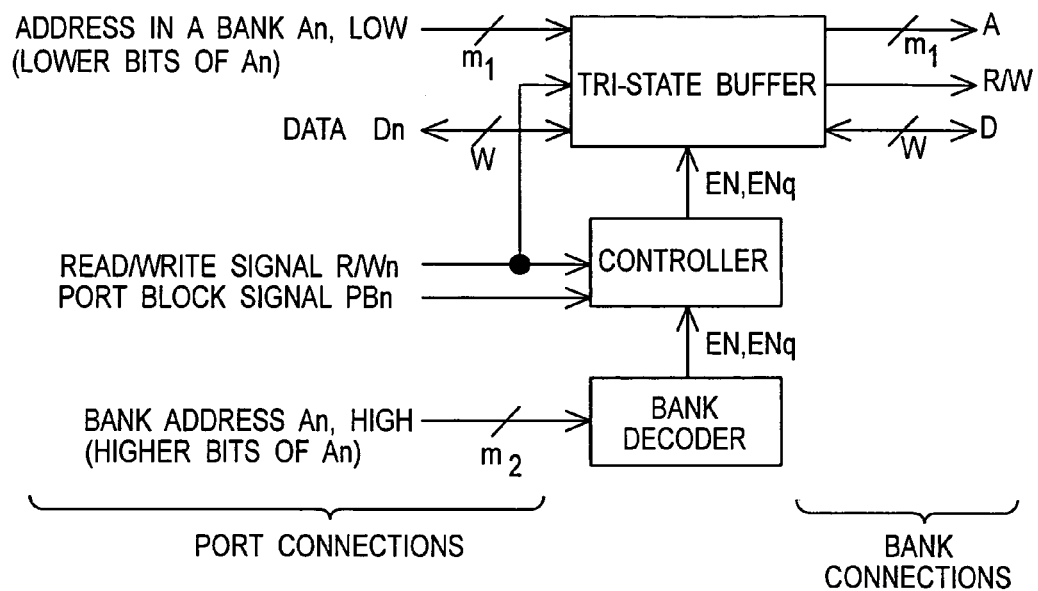
FIG. 16 is a diagram of a cross point.

In an example shown in FIG. 16, the cross point 404 includes tri-state buffers, a controller and a bank decoder. The tri-state buffers pass lower bits of address $A_n$, data $D_n$ and generates a read/write enable signal R/W according to enable signals EN, ENq activated according to the bank address of the higher bits of $A_n$, read/write enable signal $R/W_n$ and port block signal $PB_n$.

Figure 17:
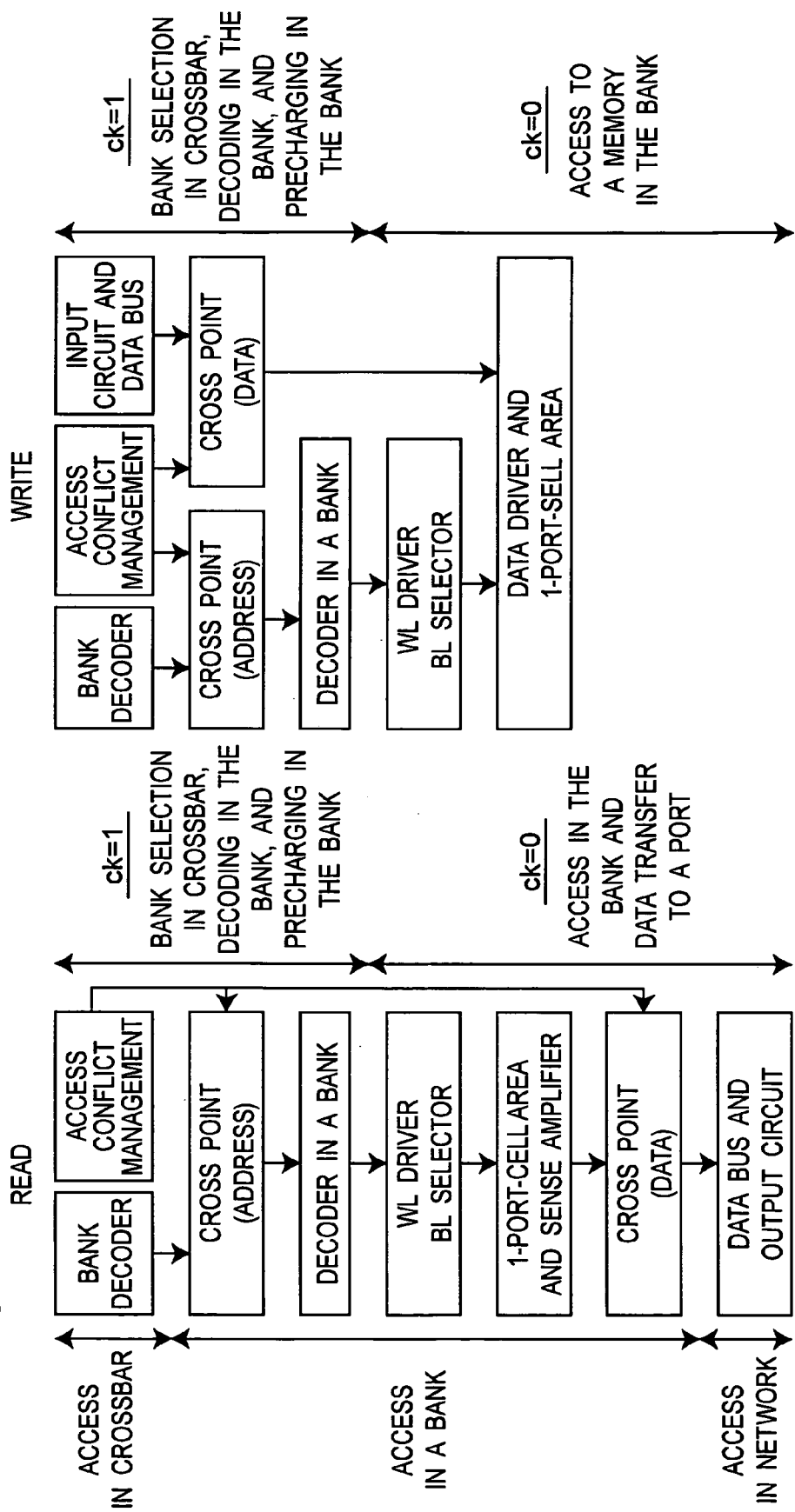
FIG. 17 is a diagram on read and write operations in a crossbar multi-port memory according to the invention.

FIG. 17 shows read and write operations according to the access process in the crossbar multi-port memory shown in FIG. 15. In the precharge period in the banks 400, the arbitration for access conflict condition and the selection of the bank and the port are overlapped, so that the memory access cycle time can be shortened.

In the case of read, in the first half of a clock cycle (ck="1"), a bank is selected in the crossbar switching network 402, decoding is performed in the bank 400, and precharging is performed in the bank 400. That is, input signals for the registers/buffers are sent in parallel to the switching network 402, and the bank decoding and 1-to-N-port transition (for address) is performed at cross points, and the decoder is operated in the bank 400.

Next, in the second half of the clock cycle (ck="0"), access (read) is performed in the bank 400, and data is sent to a port. In the bank 400, a word line is activated by a word line driver, and a bit line selector and a sense amplifier for the 1-port cell area are activated. A data read from memory cells are sent through the cross point (for data) in the crossbar switching network 402, data bus, and output circuit in the registers/buffers 104 to the external port.

In the case of write, when a clock signal is supplied, in the first half of a clock cycle (ck="1"), bank selection in the switching network, and decoding and precharging in the bank 400 are performed, similarly to the case of read. Further, the data to be written is sent in parallel through the registers/buffers 404 and the cross point in the switching network 402 to the bank 400.

Next, in the second half of the clock cycle (ck="0"), access (write) in a bank 400 is performed. That is, a data driver is activated in the bank 400 to write data to the 1-port cell area.

Figure 18:
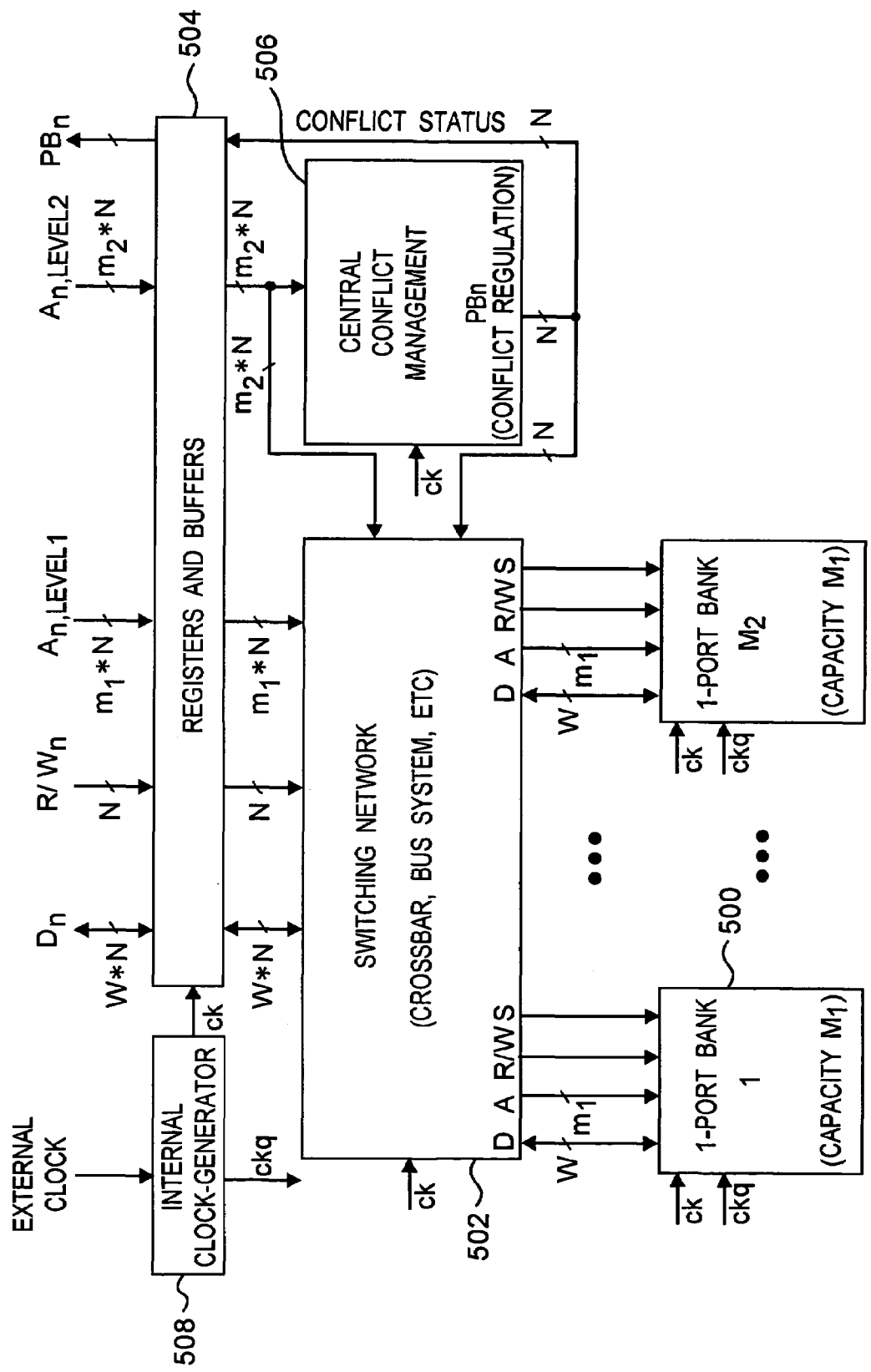
FIG. 18 is a diagram for explaining a synchronous multi-port memory with bank structure and switching network like crossbar, bus system etc.

Dynamic CMOS gates may be used for a synchronous multi-port bank memory other than the HMA memory and the crossbar multi-port memory. FIG. 18 shows an example of such a memory. A difference of this structure from that shown in FIG. 2 is only that the clock signal ck is received for dynamic CMOS gates in the crossbar switching network 502. In the memory shown in FIG. 18, a 1-port bank 500, a switching network 502, registers/buffers 504, a central conflict management circuit 506 and an internal clock generator 508 are similar to the counterparts in the memory shown in FIG. 2 except that the clock signal ck is inputted to the switching network 502.

Figure 19:
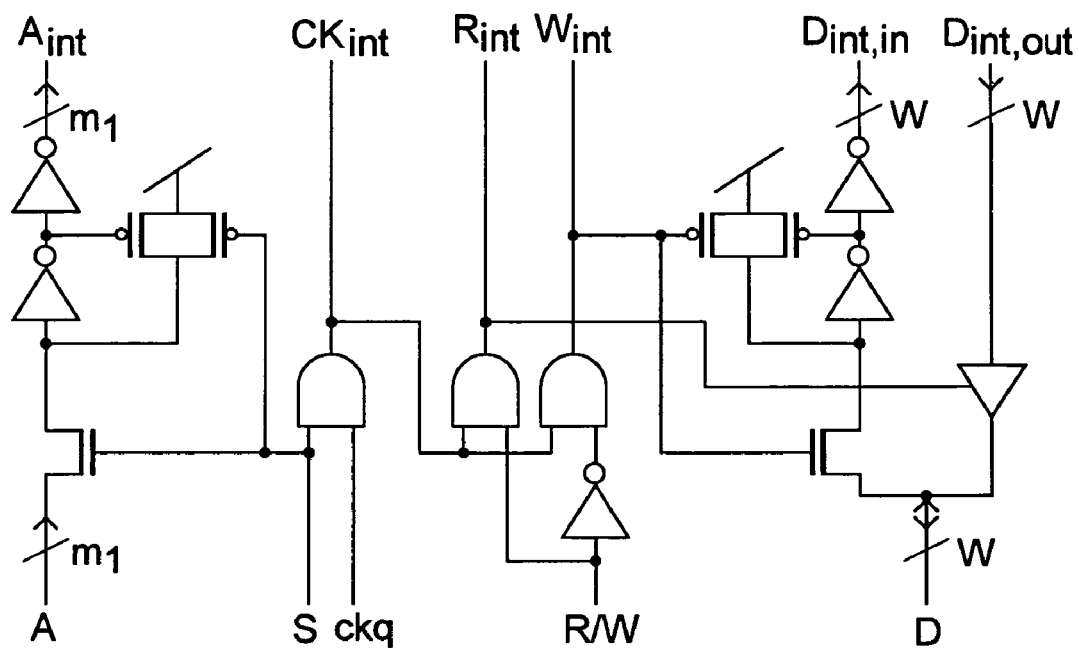
FIG. 19 is a circuit diagram of an additional circuit at the side of a bank in a multi-port memory with crossbar switches of static CMOS gates.
Figure 20:
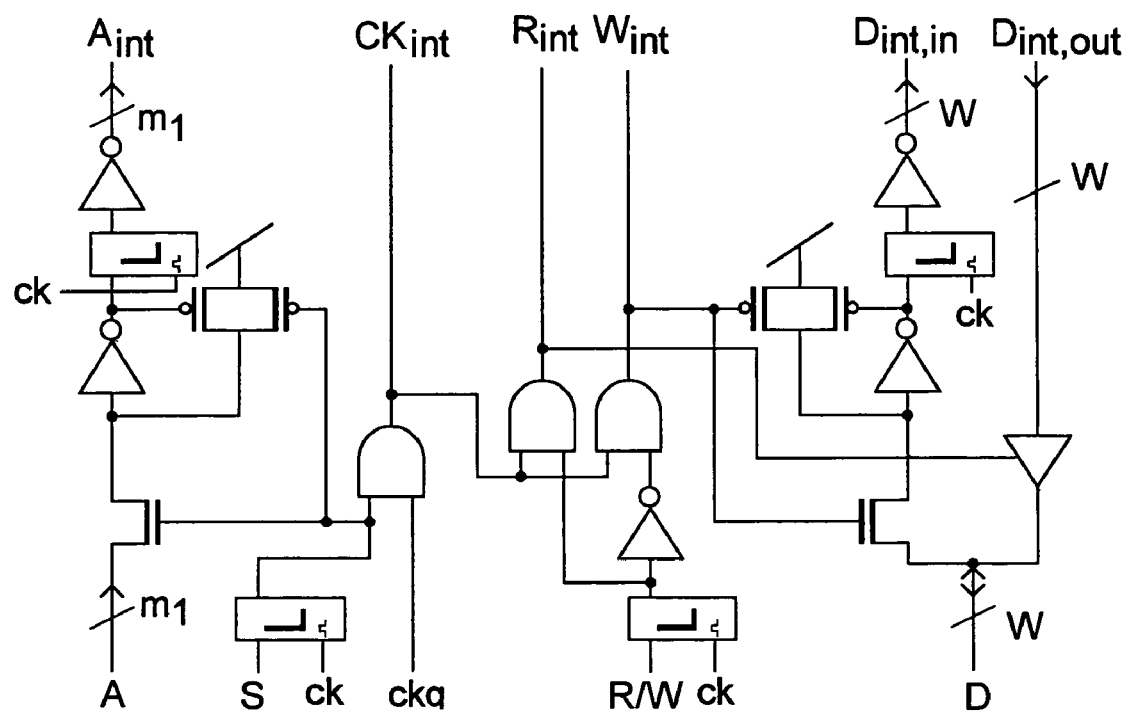
FIG. 20 is a circuit diagram of another additional circuit at the side of a bank in a multi-port memory with crossbar switches of dynamic CMOS gates.

As mentioned above, cross points in the crossbar multi-port memory are equivalent to a 1-to-N-port transition circuit in the HMA memory, when each bank is considered. Therefore, the 1-to-N-port transition circuit shown in FIGS. 6–9 and the 1-to-N-port transition circuit shown in FIGS. 11–14 for the HMA memory may be used. Further, additional circuits are needed for sending and receiving data for the banks. FIGS. 19 and 20 show the additional circuits when static CMOS gates are used and when dynamic CMOS gates are used for the cross points, respectively. In the circuit shown in FIG. 20, positions of latch circuits are set rather freely, similarly to the HMA memory, and, according to the positions of the latch circuits, the processing to be overlapped with the precharge period is determined. (In the case of a 1-port HMA memory, an AND output of the column and row selection signals CS and RS may be outputted instead of the signal S.)

(D) Application to Synchronous Distributed Crossbar Multi-Port Memory

A distributed crossbar multi-port memory corresponds to a structure wherein the crossbar in the crossbar multi-port memory is divided into clusters of the banks. If the clusters are divided in the unit of one bank, it has the equivalent structure as the HMA memory. Therefore, the distributed crossbar memory may be taken to have a multi-port memory structure intermediate between the crossbar and HMA memories.

Figure 21:
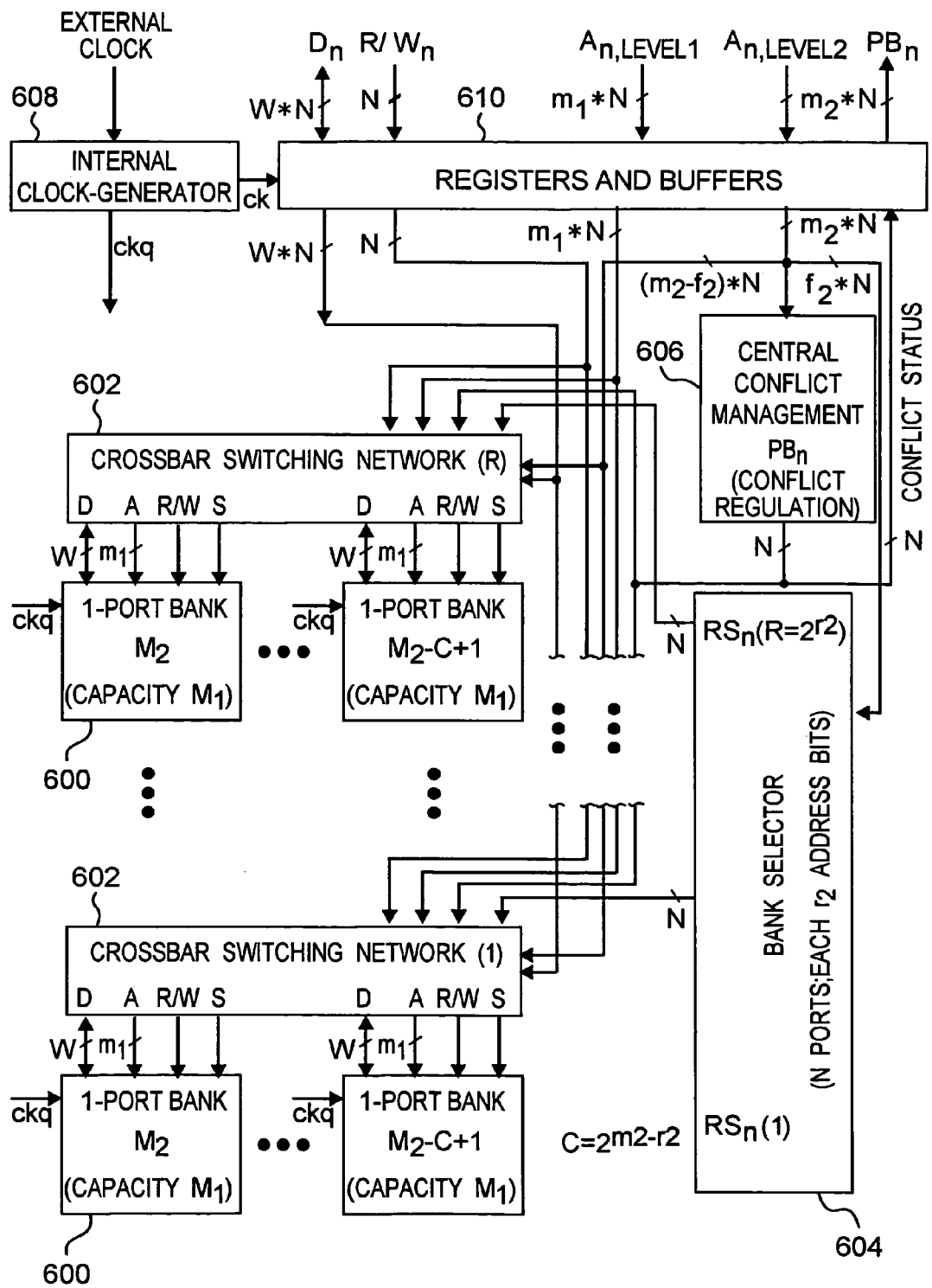
FIG. 21 is a diagram on a structure of a synchronous distributed crossbar type multi-port memory with static CMOS gates.
Figure 22:
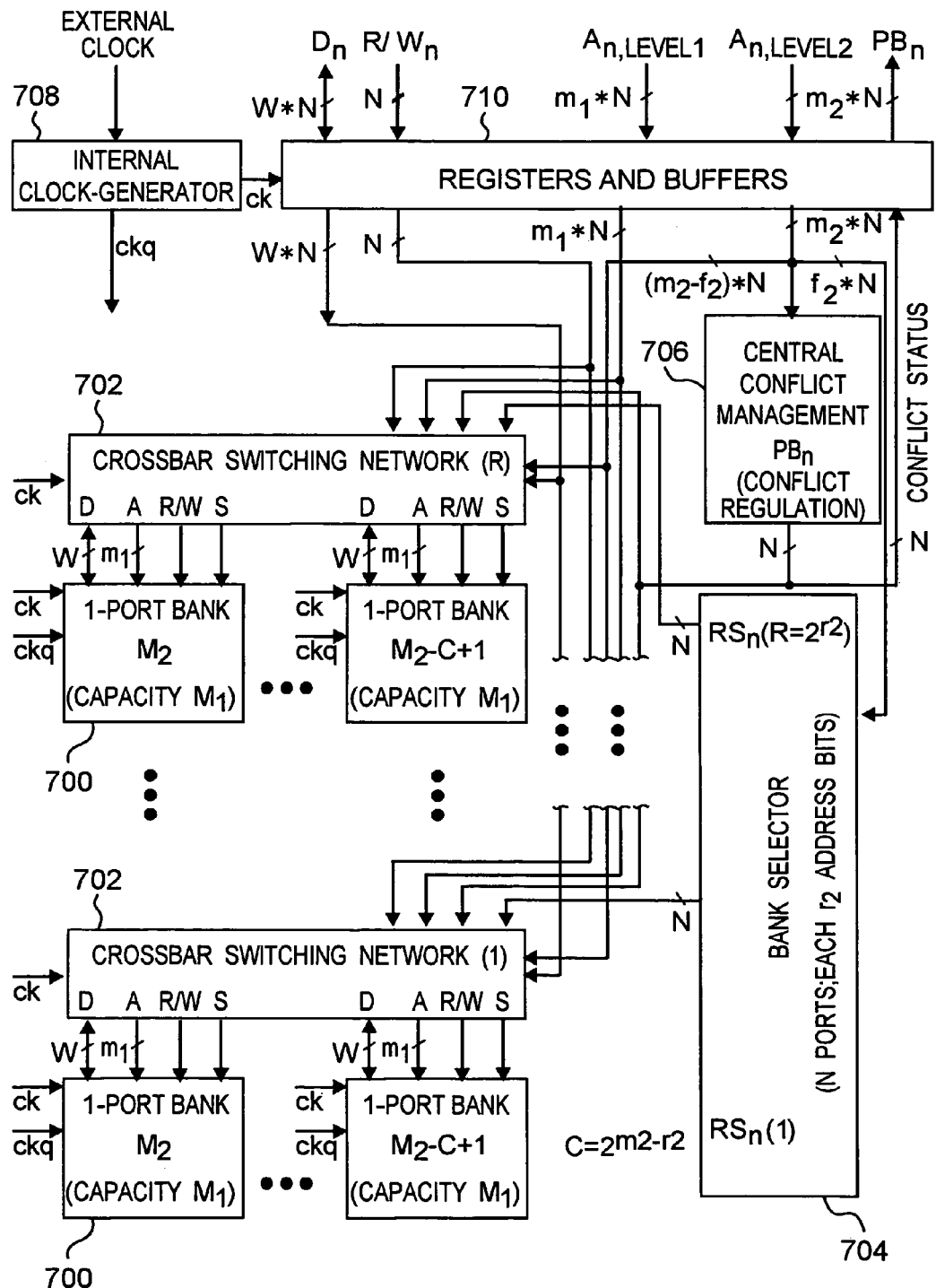
FIG. 22 is a circuit diagram on a structure of a synchronous distributed crossbar type multi-port memory with dynamic CMOS gates.

FIGS. 21 and 22 show structures of distributed crossbar multi-port memories with static CMOS circuits and with dynamic CMOS circuits, respectively. In the examples of the crossbar switching networks, the banks are divided in clusters for each column. The distributed crossbar multi-port memories may have similar circuits to the crossbar multi-port memory.

A distributed crossbar multi-port memory with static CMOS gates shown in FIG. 21 has 1-port banks 600, crossbar switching networks 602, a bank selector 604 and a central conflict management circuit 606. The banks 600 are divided into rows, and banks 600 in each bank group are connected to a crossbar switching network 602. An output signal $RS_n$ of the bank selector 604 is sent to a relevant crossbar switching network 602. Further, an internal clock generator 608 and registers/buffers 610 are provided. The internal clock generator 608 generates an internal clock signal ckq and supplies it to the banks 600. The registers/buffers 610 receive address signal A, data signal D and read/write signal R/W from the external ports and sends them to the crossbar switching networks 602. Further, it sends a part for bank address (higher address) in the address signal A to the central conflict management circuit 606 and to the bank selector 604. The registers/buffers 610 send the read/write signal R/W to a relevant crossbar switching network 602. The bank 602 includes a word line driver, a bit line driver, a sense amplifier and 1-port memory cells. Data $D_n$ is read from or written to the bank 600 according to the read/write signal R/W.

In a distributed crossbar multi-port memory with dynamic CMOS gates shown in FIG. 22, 1-port banks 700, crossbar switching networks 702, a bank selector 704, a central conflict management circuit 706, an internal clock generator 708 and registers/buffers 710 have similar structures as the counterparts in the distributed crossbar multi-port memory with static CMOS gates shown in FIG. 21. However, because the dynamic CMOS gates are used, the clock signal ck is supplied to the 1-port banks 700 and to the crossbar switching networks 702.

In the distributed crossbar multi-port memories shown in FIGS. 21 and 22, the crossbar switching networks 602, 702 are provided for two-dimensional arrangement of the banks. A crossbar switching network 602, 702 is connected to a row of banks 600, 700, and a bank selector 604, 704 sends a selection signal to the crossbar switching network 602, 702. Further, a cluster arrangement in three or more dimensions is generally possible. For example, as to the crossbar switching networks 602, 702 and a column of banks 600, 700, 1-to-N-port transition circuits may be provided for each bank for two-stage decoding. Then, a layout for each wiring design is realized. The decoding may be performed in three or more stages, and this will decrease the number of transistors.

(E) Central Conflict Management and Word Line Decoder Including Dynamic CMOS Gates and Latch Circuits A central conflict management circuit and a word line decoder with dynamic CMOS gates are explained below which can be used for all synchronous multi-port bank memories. In a synchronous multi-port bank memory, the word line decoder and the central conflict management circuit with static CMOS gates may also be used (N. Omori and H. J. Mattausch, "Compact central arbiters for memories with multiple read/write ports", Electronics Letters, Vol. 34, No. 13, pp. 811–813, 2001).

Figure 23:
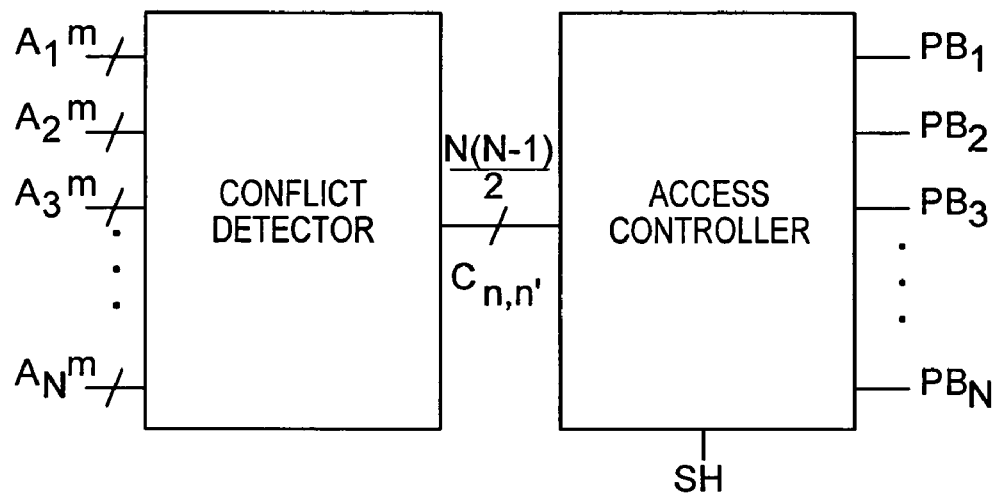
FIG. 23 is a circuit diagram of a central conflict management circuit.

As shown in FIG. 23, the central conflict management circuit includes a detector which compares all combinations between the ports to generate access conflict detection signal $C_{i,j}$ and an access controller which generates signal $PB_i$ for blocking i-th port based on signals $C_{i,j}$. It is to be noted that the port block signal $PB_i$ is set to "0" when an access conflict happens.

Figure 24:
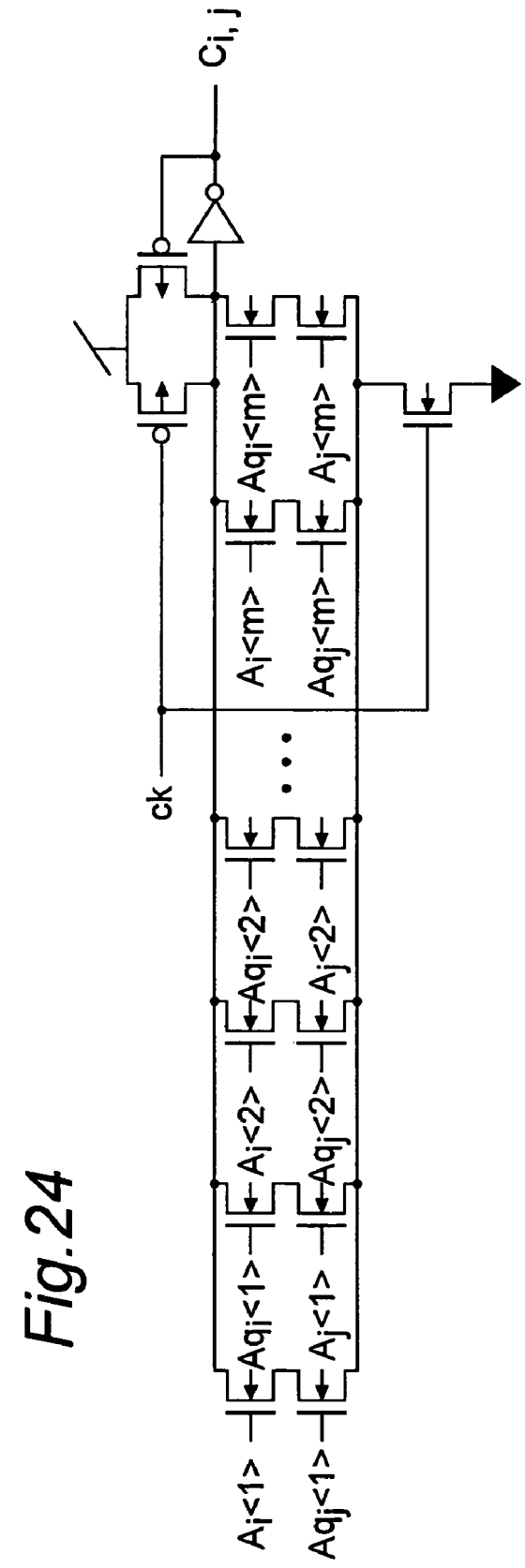
FIG. 24 is a circuit diagram of a conflict detector in a central conflict management circuit with dynamic CMOS gates.
Figure 25:
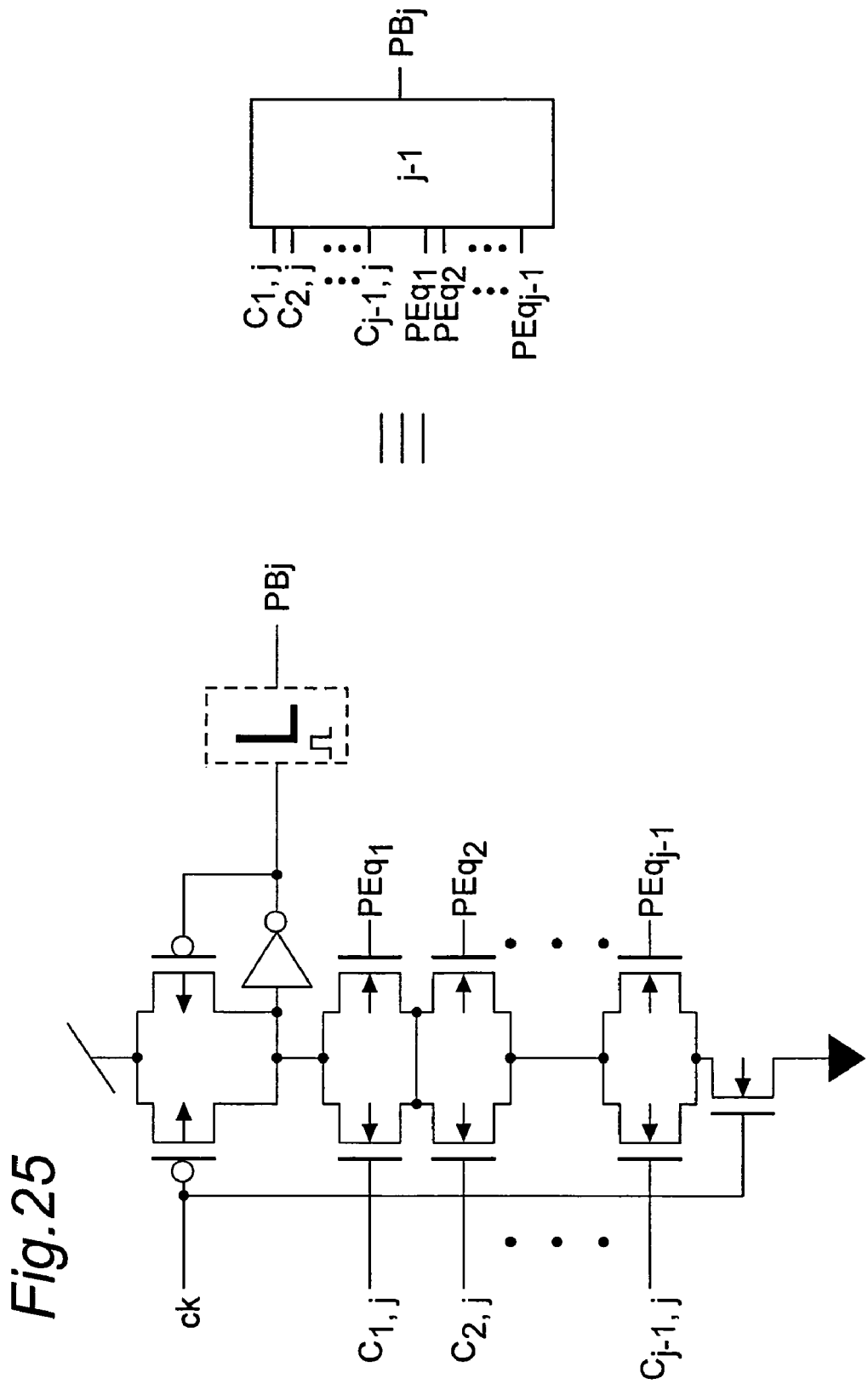
FIG. 25 is a circuit diagram of an access controller in a central conflict management circuit with dynamic CMOS gates.

FIGS. 24 and 25 show conflict detector and access controller circuits with dynamic CMOS gates according to the invention, respectively. They have simple circuit structures. The number of ports can be expanded. They occupy a small area and can be operated at a higher speed than circuits with static CMOS gates.

The central conflict detection circuit shown in FIG. 24 uses a multi-input EXNOR gate with dynamic CMOS gates. Because the inverted signal $Aq_i$ of the input address signal $A_i$ is already generated by the decoder in the bank selector, the generation of $Aq_i$ is not an overhead. The output signal $C_{i,j}$ becomes "0" if input signal $A_i=A_j$, otherwise it is "1".

Further, the access controller shown in FIG. 25 is used for a port-important-hierarchy (PIH) algorithm which gives priority to a smaller port number i ((N. Omori and H. J. Mattausch, "Compact central arbiters for memories with multiple read/write ports", Electronics Letters, Vol. 37, NO. 13, pp. 811–813, 2001). The controller performs an OR operation for the output signal $C_{j,j}$ of the central conflict management circuit and the port disable signal $PEq_i$ and an AND operation on all the results of the OR operations. By using $PEq_i$, access conflict due to a port not accessed actually can be prevented. The control based on $PEq_i$ may be realized with static CMOS gates by receiving the result of the AND operation of the output signal $C_{i,j}$ and the port disable signal $PEq_i$ as an input signal for the access controller.

Figure 26:
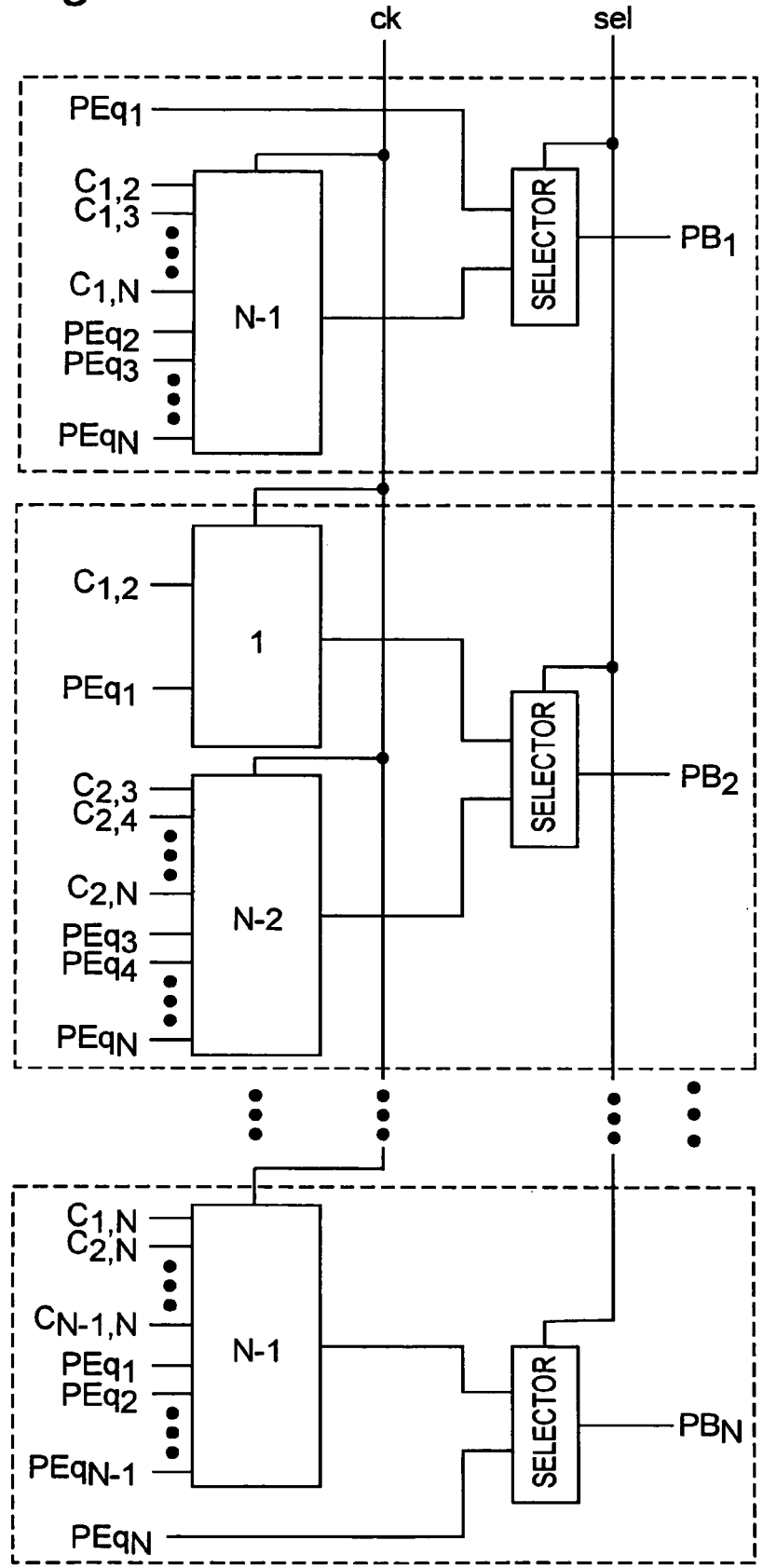
FIG. 26 is a circuit diagram of an access controller using a fair algorithm.

FIG. 26 shows an access controller which adopts a fair algorithm (refer to N. Omori and H. J. Mattausch, "Compact central arbiters for memories with multiple read/write ports", Electronics Letters, Vol. 37, NO. 13, pp. 811–813, 2001). For fair algorithm, two types of the PIH access controllers for giving priority to a bank of a smaller port number and to a bank of a larger port number are provided, and one of the outputs of the PIH access controllers is selected. Thus, the circuit used in FIG. 5 for the OR operation on the output signal $C_{i,j}$ of the central conflict detection circuit and the port disable signal $PEq_i$ and the AND operation on all the results of the OR operation may be used in this circuit.

When static CMOS gates are used in the port transition circuit and dynamic CMOS gates are used in the central conflict management circuit, it is necessary to latch the output signal $PB_i$ for an evaluation period. Then, it is needed to add a latch circuit at the output node of the signal $PB_i$.

Figure 27:
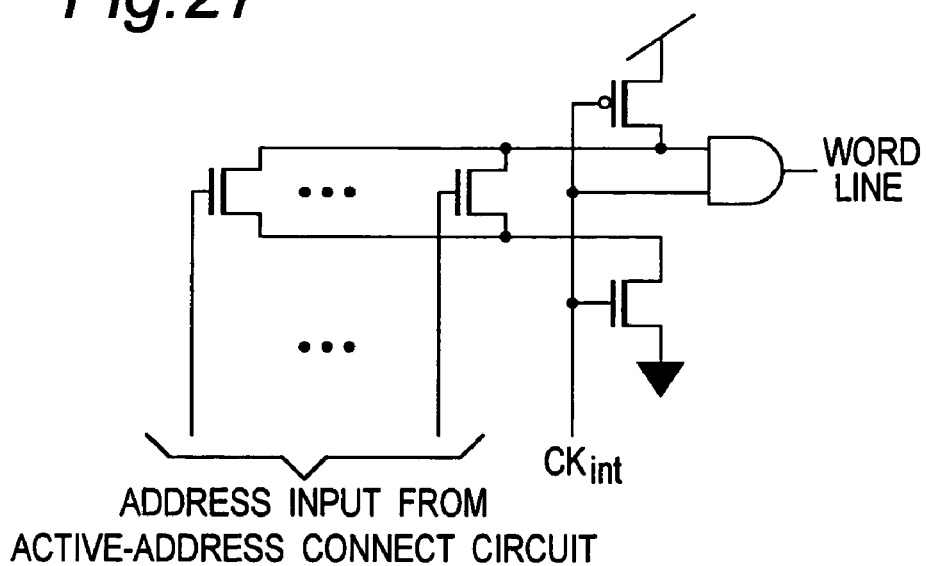
FIG. 27 is a circuit diagram of a NOR one-stage word line decoder in a bank.
Figure 28:
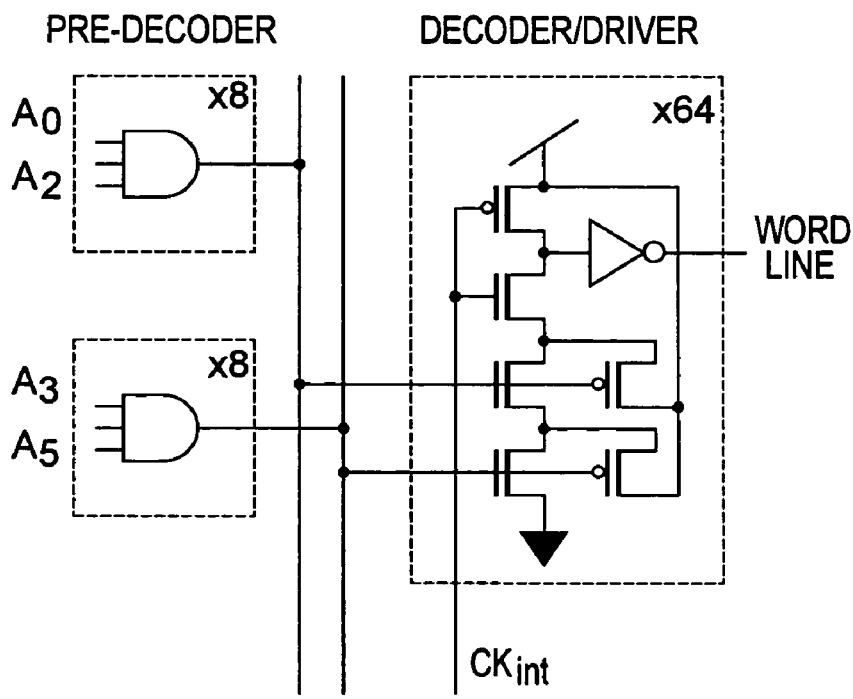
FIG. 28 s a circuit diagram of a NAND two-stage word line decoder in a bank.

FIGS. 27 and 28 show examples of a word line decoder in a bank used in this invention. FIG. 27 shows NOR gates in a one stage word line decoder, while FIG. 27 shows a device having NOR gates in a word line decoder with a plurality of stages (two stages). In the latter, the number of transistors can be reduced by adopting the multi-stage structure. In the word line decoder, the output becomes "0" in the precharge period for the bank.

Figure 29:
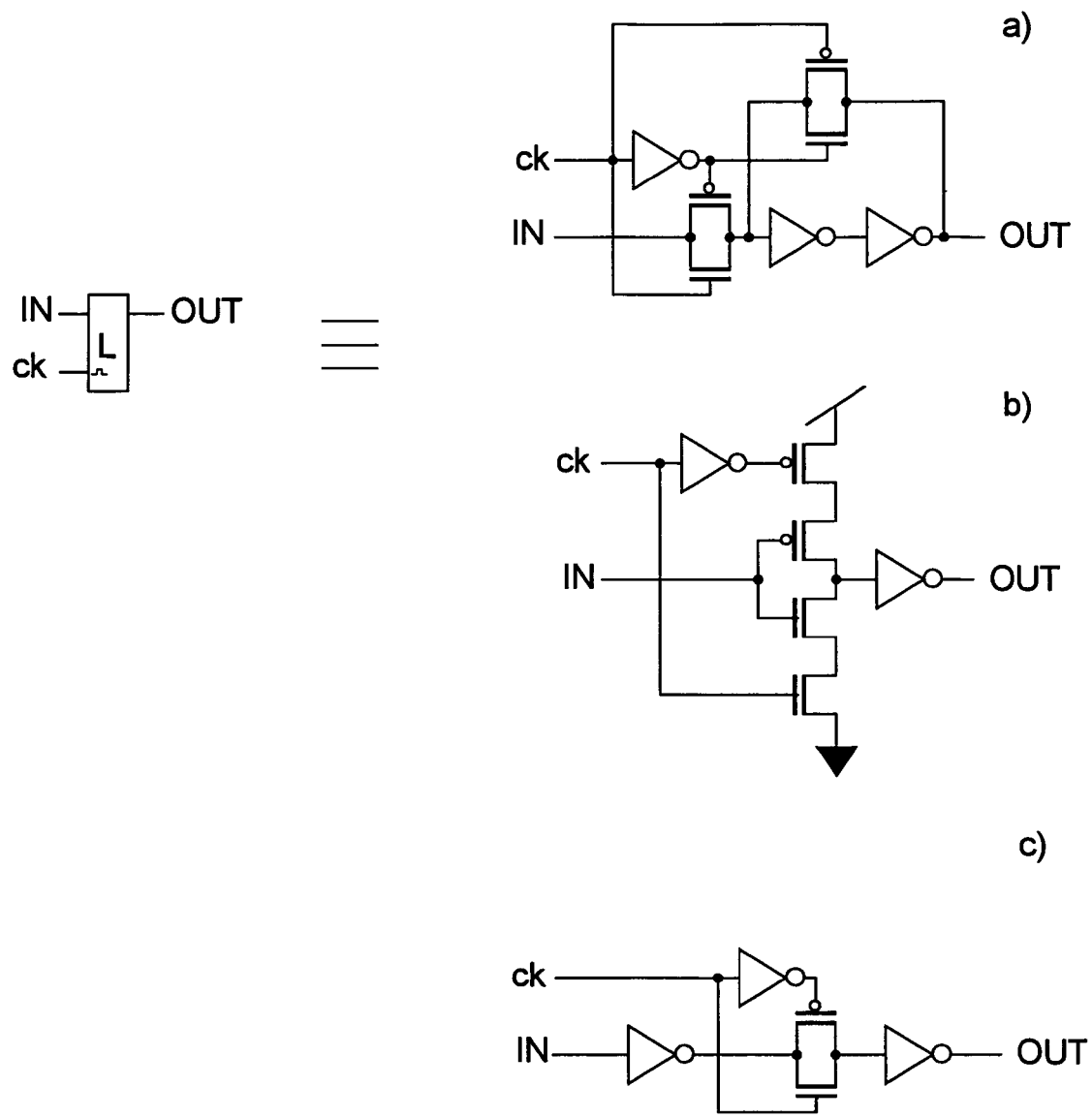
FIG. 29 is a diagram for showing three circuit diagrams of latches for multi-port bank memories with dynamic CMOS gates.

FIG. 29 shows examples of a latch circuit with dynamic CMOS gates. FIG. 29(a) shows a latch with static CMOS gates, while FIGS. 29(b) and (c) show dynamic latch circuits which use charges at the storage node.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A synchronous bank memory comprising:
   a plurality of first layer modules, each of which including a bank consisting of a plurality of 1-port memory cells and a port transition circuit between 1 port and N ports;
   a clock generator which generates an internal clock signal and sends the internal clock signal to said plurality of first layer modules;
   registers and buffers which receive a read/write signal and an address signal from each of external ports, receive and send a data signal to and from each of the external ports, and receive and send a port block signal;
   an access conflict management circuit which receives the address signals from said registers and buffers and generates the port block signal when an access conflict to a bank occurs;
   a bank column selector arranged between said registers and buffers and said plurality of banks, which receives the read/write signal and the address signal from said registers and buffers and the data signal from said registers and buffers or said plurality of banks, generates a bank column selection signal based on the address signal to output it to said plurality of banks; and
   a bank row selector which receives the address signal from said registers and buffers and generates a bank row selection signal based on the address signal to output it to said plurality of banks selected by the bank row selection signal among said plurality of banks;
   wherein said port transition circuit activates a bank among said plurality of banks based on the bank column selection signal and bank row selection signal when no port block signal is outputted by said access conflict management circuit.

2. The synchronous bank memory according to claim 1, including static CMOS gates;
   wherein said port transition circuit comprises an active-address-connect circuit which selects an address, an active-data-connect circuit which selects a data, and a bank-enable controller which controls said active-address-connect circuit and said active-data-connect circuit;
   said bank-enable controller generates an address switch enable signal and a precharge control signal for address lines in said active-address-connect circuit, based on the read/write signal, the row and column selection signals and the port block signals for each port, and sends the generated signals to said active-address-connect circuit;
   said bank-enable controller generates a read access enable signal and a write access enable signal for each port and a precharge control signal for data lines in said active-data-connect circuit and sends them to said active-data-connect circuit; and
   said bank-enable controller generates a control clock signal in the bank based on the internal clock signal from said clock generator.

3. The synchronous bank memory according to claim 1, including dynamic CMOS gates and dynamic CMOS latch circuits, wherein said access conflict management circuit and said port transition circuit receive the internal clock signal to control said dynamic CMOS gates in said access conflict management circuit and said port transition circuit and to control said dynamic CMOS latch circuits for latching data when the dynamic CMOS gates enter a precharge period.

4. The synchronous bank memory according to claim 3, wherein said port transition circuit comprises an active-address-connect circuit which selects an address, an active-data-connect circuit which selects a data, and a bank-enable controller which controls said active-address-connect circuit and said active-data-connect circuit;
   said bank-enable controller generates an address switch enable signal and a precharge control signal for address lines in said active-address-connect circuit, based on the read/write signal, the row and column selection signals and the port block signals, and sends them to said active-address-connect circuit;
   said bank-enable controller generates a read access enable signal and a write access enable signal for each port and a precharge control signal for data lines in said active-data-connect circuit and sends them to said active-data-connect circuit; and
   said bank-enable controller generates a control clock signal in the bank based on the internal clock signal from said clock generator.

5. The synchronous bank memory according to claim 4, wherein said active-address-connect circuit comprises an NMOS transmission gate as a gate for sending the address signal to the bank.

6. The synchronous bank memory according to claim 4, wherein said active-data-connect circuit comprises an NMOS transmission gate as a gate for sending the data signal to the bank.

7. The synchronous bank memory according to claim 3, wherein said access conflict management circuit comprises a multi-input EXNOR gate made of dynamic CMOS gates, the multi-input EXNOR gate receives an address signal and its inverted signal form the ports to generates a signal which represents whether access conflict occurs between addresses of a pair of ports in the ports.

8. The synchronous bank memory according to claim 3, wherein said access conflict management circuit comprises OR gates of signals which represent whether an access conflict happens on addresses of a pair of ports in the ports and a port disable signal, an AND gate of results of all the OR gates, and an output circuit which sends an output of the AND circuit as the port block signal.

9. The synchronous bank memory according to claim 3, wherein said access conflict management circuit comprises a circuit for giving priority to a port of a smaller port number, another circuit for giving priority to a port of a larger port number, and a selector which selects one of outputs of the two circuits to output the port block signal.

10. A synchronous bank memory comprising:
    a plurality of banks including of a plurality of 1-port memory cells;
    a clock generator which generates an internal clock signal and sends the internal clock signal to said plurality of banks;
    registers and buffers which receive a read/write signal and an address signal from each of external ports, receive and send a data signal to and from each of the external ports, and receive and send a port block signal;
    an access conflict management circuit which receives the address signals from said registers and buffers and generates the port block signal when an access conflict occurs; and
    a crossbar switching network, provided between said registers and buffers and said plurality of banks, performing switching at cross points at a plurality of nodes, each of the nodes being located between a line connected to the ports and signal lines from said banks, wherein said crossbar switching network receives the read/write signal and the address signal from said registers and buffers and the data signal from said registers and buffers or said plurality of banks, activates one of the cross points based on the address signal when no port block signal is outputted by said access conflict management circuit.

11. A synchronous bank memory comprising:
    a plurality of banks including of a plurality of 1-port memory cells;
    a clock generator which generates an internal clock signal and sends the internal clock signal to said plurality of banks;
    registers and buffers which receive a read/write signal and an address signal from each of external ports, receive and send a data signal to and from each of the external ports, and receive and send a port block signal;
    an access conflict management circuit which receives the address signals from said registers and buffers and generates the port block signal when an access conflict occurs; and
    a plurality of crossbar switching networks provided between said registers and buffers and a plurality of clusters into which said plurality of banks are divided, wherein each of said plurality of crossbar switching networks performs switching at cross points at nodes, each of the nodes being located between lines connected to the ports and a signal line from each bank in a cluster;
    wherein each of said crossbar switching networks receives the read/write signal and the address signal from said registers and buffers and the data signal from said registers and buffers or said plurality of banks, activates a cross point based on the address signal when no port block signal is outputted by said access conflict management circuit.

12. A synchronous bank memory comprising:
    a plurality of banks including a plurality of 1-port memory cells;
    a clock generator which generates an internal clock signal and sends the internal clock signal to said plurality of banks;
    registers and buffers which receive a read/write signal and an address signal from each of external ports, receive and send a data signal to and from each of the external ports, and receive and send a port block signal;
    an access conflict management circuit which receives the address signals from said registers and buffers and generates the port block signal when an access conflict occurs; and
    a network provided between said registers and buffers and said plurality of banks, wherein said network receives the read/write signal and the address signal from said registers and buffers and the data signal from said registers and buffers or said plurality of banks, generates a bank selection signal when no port block signal is outputted by said access conflict management circuit, and activates the bank selected by the bank selection signal.

13. A synchronous bank memory comprising:
    a plurality of banks including a plurality of 1-port memory cells;

a clock generator which generates an internal clock signal and sends the internal clock signal to said plurality of banks;

registers and buffers which receive a read/write signal and an address signal from external ports, receive and send a data signal to and from external ports, and receive and send a port block signal; and a network, provided between said registers and buffers and said plurality of banks, wherein said network receives the read/write signal and the address signal from said registers and buffers, generates a bank selection signal to activate the bank selected by the bank selection signal.

14. A method for accessing a synchronous bank memory including a plurality of banks each including a plurality of 1-port memory cells, a clock generator which generates an internal clock signal, registers and buffers which receive a read/write signal and an address signal from each of external ports, receive and send a data signal to and from each of the external ports, and a switching network provided between said registers and buffers and said plurality of banks;

wherein when a clock cycle is started, the registers and buffers send the read/write signal and the address signal to the switching network and send the address signals to the access conflict management circuit, the switching network generates a bank selection signal when a port block signal is not received from the access conflict management circuit, and a bank in the plurality of banks, all of which are in precharged state for read/write state for read/write operation, is selected by the bank selection signal; and when the selected bank receives an internal clock signal from the clock generator, memory cells in the bank are accessed, and if read is instructed, the read data is sent to the port.

15. A method for accessing a synchronous bank memory including a plurality of banks each including a plurality of 1-port memory cells, a clock generator which generates an internal clock signal, registers and buffers which receive a read/write signal and an address signal from an external port, receive and send a data signal to and from the external ports, and a switching network provided between the registers and buffers and the plurality of banks;

wherein when a clock cycle is started, the registers and buffers send the read/write signal and the address signal to the switching network, the switching network generates a bank selection signal, and when the bank selection signal is received, a bank, being in precharged state for read/write operation, is selected by the bank selection signal; and when the selected bank receives an internal clock signal from the clock generator, a memory cell in the bank is accessed, and if read is instructed, the data is sent to the port.

* * * * *